United States Patent
Csete et al.

(10) Patent No.: US 9,291,915 B2
(45) Date of Patent: Mar. 22, 2016

(54) LITHOGRAPHIC METHOD WITH THE CAPABILITY OF SPECTRUM ENGINEERING TO CREATE COMPLEX MICROSTRUCTURES

(75) Inventors: Mária Csete, Szeged (HU); Áron Sipos, Szeged (HU); Anikó Szalai, Szeged (HU)

(73) Assignee: University of Szeged, Szeged (HU)

( * ) Notice: Subject to any disclaimer, the term of this patent is extended or adjusted under 35 U.S.C. 154(b) by 0 days.

(21) Appl. No.: 14/240,170

(22) PCT Filed: Aug. 23, 2012

(86) PCT No.: PCT/HU2012/000078
§ 371 (c)(1),
(2), (4) Date: Apr. 17, 2014

(87) PCT Pub. No.: WO2013/027075
PCT Pub. Date: Feb. 28, 2013

(65) Prior Publication Data
US 2014/0226139 A1    Aug. 14, 2014

(30) Foreign Application Priority Data
Aug. 23, 2011 (HU) .................. 1100461

(51) Int. Cl.
*G03F 7/20* (2006.01)
*G03F 7/16* (2006.01)
(Continued)

(52) U.S. Cl.
CPC .......... *G03F 7/70408* (2013.01); *G02B 5/1809* (2013.01); *G03F 7/168* (2013.01); *H01L 21/027* (2013.01); *G03F 2007/2067* (2013.01); *G03H 2001/0441* (2013.01)

(58) Field of Classification Search
CPC ................ G03F 7/70408; G03F 7/168; G03F 2007/2067; H01L 21/027; G02B 5/1809; G03H 2001/0441
See application file for complete search history.

(56) References Cited

U.S. PATENT DOCUMENTS

| 7,057,832 B2 * | 6/2006 | Wu et al. .................. 359/811 |
| 2008/0153285 A1 * | 6/2008 | Cain ........................ 438/642 |
| 2010/0080954 A1 * | 4/2010 | Mohseni ................... 428/131 |

FOREIGN PATENT DOCUMENTS

| CN | 101058403 | * 5/2007 |
| JP | 2007-322503 | * 12/2007 |

OTHER PUBLICATIONS

Pena et al. "Direct writing of micro/nano-scale patterns by means of particle lens arrays scanned by a focused diode pumped Nd:YVO4 laser", Appl. Phys. A vol. 101 pp. 287-295 (Jun. 2010).*

(Continued)

*Primary Examiner* — Martin Angebranndt
(74) *Attorney, Agent, or Firm* — Fitch, Even, Tabin & Flannery LLP

(57) ABSTRACT

The present invention relates to a method for microstructuring a substrate. In the method according to the invention a substrate with a region to be structured is provided, and then by applying colloid spheres into this region, a colloid sphere monolayer is formed. The thus applied colloid sphere monolayer exhibits a certain geometrical symmetry. Said colloid sphere monolayer is then illuminated with a beam of spatially modulated intensity distribution synchronized to said monolayer, thereby performing mechanical structuring in said region in conformity with a desired pattern through concentrating beam intensity via near-field effect behind said colloid sphere monolayer in the propagation direction of light.

22 Claims, 11 Drawing Sheets

(51) Int. Cl.
*G02B 5/18* (2006.01)
*H01L 21/027* (2006.01)
*G03H 1/04* (2006.01)

(56) References Cited

OTHER PUBLICATIONS

Khan et al. Parallel near field optical micro/nanopatterning on curved surfaces by transported micro-particle lens arrays, J Phys. D: Appl. Phys., vol. 43 305302 (6 pp) (Jul. 2010).*
Wu et al. "Fabrication of two-dimensional micropatterns using microspheres as lenses for projection photolithography", Appl. Phys. Lett., vol. 78(16) pp. 2273-2275 (Apr. 2001).*
Sipos et al."Plasmonic structure generation by laser illumination of silica colloid spheres deposited onto prepatterned polymer-bimetal films", Appl. Surf. Sci., vol. 255 pp. 5138-5145 (2009).*
Nedyalkov et al. "Near field properties of a gold nanoparticles array on different substrates excited by a femtosecond laser". Nanotech. vol. 18 305703 (7pp) Jun. 2007).*
Winkleman et al., "Directed self-assembly of spherical particles on patterned electrodes by an applied field", Adv. Mater., vol. 17 pp. 1507-1511—(2005).*
Jun et al. "Holographically defined nanoparticles placement in 3D colloidal crystals", JACS Commun. vol. 132(29) pp. 9958-9959 (Jun. 2010).*
Ceste et al., "Integrated lithography to produce complex structures for spectral engineering", 12 pages, 5 figures (arXiv, Dec. 2011) is the earliest available public disclosure of the work by the applicant.*
Baumgartl et al., "Tailoring of photonic band structure in colloidal crystals", Phys., Rev. Lett., vol. 99(20) pp. 205503 (4 pages) (Nov. 2007) teaches reordering of colloidal monolayers, but not the structuring of the substrate.*
Gou et al., "Near field laser parallel nanofabrication of arbitrary-shaped patterns", Appl. Phys. Lett., vol. 90(24) pp. 243101 (3 pages) (2007).*
Kuhler et al., "Imprinting the optical near field of microstructures with nanometer resolution", Small vol. 5(16) pp. 1825-1829 (2009).*
Mikhael et al, "Proliferation of anomalous symmetries in colloidal monolayers subjected to quasiperiodic light fields", PNAS vol. 107(16) pp. 7214-7218 (Apr. 2010).*
Angioni, C., European Search Report; PCT/HU2012/000078 dated May 15, 2013; 3 pages.

* cited by examiner

LITHOGRAPHIC METHOD WITH THE CAPABILITY OF SPECTRUM ENGINEERING TO CREATE COMPLEX MICROSTRUCTURES

CROSS-REFERENCE TO RELATED APPLICATIONS

This application is the National Stage of International Application No. PCT/HU2012/000078, filed Aug. 23, 2012, which claims priority to HU P1100461 filed Aug. 23, 2011, both of which are incorporated by reference in their entireties.

The present invention relates to a novel kind of microstructuring method. In particular, the present invention relates to a method to modify and optionally also to engineer structural spectra, i.e. mainly absorption and/or emission (and corresponding transmission) spectra of solid materials, especially of metals, in a controlled manner. Specifically, the subject matter of the present invention is a novel lithographic method, by means of which complex microstructures of predefined spectra can be fabricated in at least one, more preferably in at least two spatial directions within a region of relatively large physical dimension.

Here, and from now on, the term "microstructure" refers to a structured system of microscopic objects, forming optionally a periodic pattern, with size extending down to just the nanometer (nm) range.

Besides traditional multistep lithographic processes, to fabricate surface (2D) and volume (3D) structures with a periodicity that falls into the submicron (sub-µm) range, nowadays interference lithography techniques based on e.g. laser light are used extensively. In most cases these techniques are combined with imaging techniques. The essence of the thus obtained processes is that a periodic pattern, for example two lattices that are crossed, is arranged in the object plane of an imaging objective and only certain beams from amongst the diffracted ones provided with the illumination by laser light are allowed to get into the image plane while all other beams are appropriately blocked. Hence, an interference pattern corresponding to the periodic structure to be fabricated appears in the image plane (the object, or rather a surface thereof, to be processed will be arranged in this plane), that is, the illumination takes place in conformity with a predefined pattern. As a consequence, a controlled periodic structuring of said surface realizes.

Machining materials by ultrashort, i.e. sub-picosecond (sub-ps), in particular femtosecond (fs) laser pulses, altering the electron structure thereof in this way and thereby attributing them with novel physical/chemical properties represent nowadays a major field of research in material science. In case of short pulses, it is a complicated task to match the phases of the interfering beams. Solutions aiming to solve this problem are taught in a scientific publication by T. Kondo et al., by means of multi-beam interference of fs laser pulses (for further details the reader is referred to Appl. Phys. Letters 82, pp. 2758-2760 (2003); "Multiphoton fabrication of periodic structures by multi-beam interference of femtosecond pulses") or in a scientific paper by J. H. Klein-Wiele et al., by exploiting the 4-beam interference of sub-ps laser pulses with a wavelength of 248 nm (for further details the reader is referred to Journ. of Appl. Phys. A 79, pp. 775-778 (2004); "Sub-micron patterning of solid materials with ultraviolet femtosecond pulses").

A laser ablation process combined with confocal lithography is disclosed in a scientific paper by Y. Nakata et al. (for further details the reader is referred to Journ. of Appl. Phys. A 79, pp. 1481-1483 (2004); "Lithographic laser ablation using femtosecond laser"). A laser pulse of 90 fs in duration and 800 nm in central wavelength passing through a mask with a given pattern (or through a diffraction grating) was focused on a thin film of polycrystalline gold (of about 50 nm in thickness) evaporated onto a substrate made of vitreous silica. Then, a periodic (square) lattice of holes of about 800 nm in diameter and located 1.7 µm apart from one another was formed therein by means of 4-beam interference. It was also shown that an interference pattern generated by 9-beam interference appears in deeper-lying layers of said gold thin film as well, although it is a little bit distorted in shape.

The greatest disadvantage of the above discussed interference lithographic techniques is that the size of the objects formable by making use of said techniques is limited from below, i.e. objects of arbitrarily small size cannot be obtained by these techniques. Particularly, in the simplest possible case of such processes based on two-beam interference one cannot go beyond the diffraction limit, i.e. objects with a characteristic length smaller than the half of the wavelength simply cannot be fabricated. In processes based on multi-beam interference said diffraction limit can though be exceeded, this is achieved, however, only in a relatively complicated way and indirectly, by means of a huge pool of technical tools, i.e. in a rather expensive manner. The pattern obtained is also very complex as to the topology; moreover, it also comprises a background pattern which is hardly controllable.

The lithographic technique referred to in literature as colloid sphere lithography (or micro-/nanosphere lithography) involves several different processes based on the usage of colloid spheres. The essence of said processes lies in that a monolayer is prepared on a suitable substrate from polymer (in most cases poly-styrene) beads/spheres or Stöber-type quartz beads/spheres of µm and/or sub-µm in size by means of e.g. the per se known Langmuir-Blodgett technique, as it is discussed in the paper of K. Blodgett (see Phys. Rev. 55, pp. 391-404 (1939)).

In colloid sphere lithographic processes using laser the thus obtained hexagonal structured layer, utilized as a microlens layer, is then illuminated with a homogeneous laser beam (see e.g. the publication by S. M. Huang et al., in Journ. of Appl. Phys. 92/5, p. 2495 (2002)). By illuminating the colloid spheres with coherent laser light, a significant increase in intensity can be achieved that, for a given wavelength $\lambda$, depends on the diameter d of the colloid spheres used. In the propagation direction of laser light, the intensity distribution behind the layer of said spheres is determined by the optical resonances for spheres with a diameter larger than the illumination wavelength and the near-field effects for spheres with a diameter smaller than the illumination wavelength. The position of the plane of maximal intensity is specified by the size and the index of refraction relative to the surrounding medium of the spheres used.

As a result of the increase in intensity, objects with a dimension a smaller than the spheres used (optionally objects with a size falling even below the diffraction limit) can be "inscribed" into the materials, or rather into the surface layer thereof, being suitable for this and arranged behind the layer of the spheres. The examinations show that the dimension a of the inscribed objects highly depends on the actual intensity distribution appearing at the location of said inscription; the smaller the full width at half maximum of the intensity distribution on the surface behind the colloid spheres is, the smaller size—within a certain limit—considering the dimension a of the inscribed objects can be achieved. In the thus obtained structure, the inscribed objects show an in-plane periodic hexagonal arrangement, the distance between the individual objects always corresponds to the diameter d of the spheres. As a consequence of the identical size of the colloid spheres, the individual objects with a size of sub-μm/nm, i.e. of 100 nm/1-10 nm, fabricated by the process evenly distribute over the surface and define a structure with the order set by the apices of the regular hexagons. When applying a homogeneous illumination, the ratio of the dimension a of the objects and the distance d between said objects is a constant value that depends on the wavelength and the diameter. The lateral fine-structure of the intensity distribution within the processed area can be tuned with the angle of incidence θ of the illuminating beam; due to the concentration of obliquely incident beams in near-field behind the spheres, sub-structures of various symmetry can be inscribed into the surface in a controlled manner, as it is discussed in a scientific paper by W. Guo et al. (for further details the reader is referred to Appl. Phys. Lett. 90, p. 243101 (2007)).

By substituting the dielectric colloid spheres with metal colloid spheres, the local intensity can be further increased as in such a case surface plasmon polaritons (SPP) appear on the metal interface. A paper by N. N. Nedyalkov et al. (for further details the reader is referred to Appl. Phys. A 85, pp. 163-168 (2006)) discloses a nanostructuring process realized by gold (Au) nanospheres of various diameters applied onto a silicon (Si) substrate by spin-coating technique. Here, illumination of the surface was performed on a one shot basis by laser pulses of 100 ns in duration and 820 nm in central wavelength. The laser pulses were focused onto the substrate surface by means of a suitable optical system in a propagation direction perpendicular to said surface. Due to the ablation achieved in this way, nano-holes with a size below the diffraction limit formed in the surface layer of the Si substrate. In particular, when Au spheres of 200 nm in diameter were used, nanoholes of about 40 nm in diameter were generated at laser fluences below the ablation threshold of bulk Si. The near-field increase in intensity induced by the metal spheres was maximal according to the tests when said metal spheres were arranged on a substrate having a metallic surface, as it is discussed in detail in a publication by N. N. Nedyalkov et al. (for further details the reader is referred to Nanotechnology 18, p. 305703 (2007)).

A further essential difference between dielectric and metal colloid spheres lies in that the illumination of individual colloid spheres made of metal by linearly and circularly polarized light results in the increase in intensity prominently along the periphery of the spheres, as it was exposed by E. Flutter et al. (for further details the reader is referred to Adv. Matter. 16, p. 1685 (2004)).

Due to the transient change in conductivity of the dielectric material induced by the short pulsed laser irradiation, it becomes possible to fabricate nanoholes with significantly smaller size than that of the colloid spheres, located along the sides of the hexagons, as a result of which the electromagnetic (EM) field getting concentrated along the edges of the spheres (for further details the reader is referred to a paper by M. Obara et al., SPIE 7027, pp. 1-10 (2008)).

The greatest disadvantage of colloid sphere lithography with homogeneous laser light is that the parameters characterizing the thus fabricated structures, that is, the dimension a and the distance d cannot be varied separately in an arbitrary manner; only the ratio of said parameters can be changed by the process concerned. Moreover, said ratio is also bounded that manifests itself in the fact that said focusing cannot be accomplished with spheres of large size, while when using spheres of small size merely nanoholes can be fabricated. A yet further disadvantage of the process is that the (self-organizing hexagonal) geometrical structure of the colloid sphere monolayer defines uniquely the symmetry properties of the structure fabricated thereby.

A two-beam interference lithographic structuring method is disclosed by a publication of A. Sipos et al. (for further details the reader is referred to Appl. Surf. Science 255, pp. 5138-5145 (2009)), according to which a primary template is fabricated by the initial structuring of a polycarbonate substrate surface. The recesses of the structure obtained by the method are then filled up with colloid spheres, as a result of which a secondary template with colloid sphere lines ordered in parallel to one another is obtained. By illuminating the secondary template with homogeneous laser light, linear patterns of holes with nanometer sized diameters can be fabricated in the substrate. A disadvantage of the method lies in that distributing said colloid spheres evenly on the primary template is rather difficult to be achieved experimentally, and therefore, the complex pattern realizable in this way will not be a pattern of perfect order.

In light of the above, the primary object of the invention is to work out a novel microstructuring method, as well as to provide a novel type setup to create complex microstructures, that allow to vary separately each of the major microscopic parameters determining optical properties of the microstructures fabricated by making use of the setup and the microstructuring method, and therefore are suitable for the predetermined/desired modification of e.g. absorption and/or emission (and corresponding transmission) spectra.

A further object of the present invention is to work out a method and a system for fabricating microstructures, by means of which a pattern of periodically arranged objects with a preset symmetry, preferentially objects with a spatial dimension smaller than the wavelength and/or nano-objects can be created over a relatively large surface area.

A yet further object of the present invention is to work out a microstructuring method and system, by means of which 2D and/or 3D structures with a variable spectrum can equally be fabricated.

A yet further object of the present invention is to work out a method and a system to form microstructures, by means of which the formation of a background pattern can be restrained, preferably substantially eliminated, simultaneously with the fabrication of the desired microstructure, or all the important parameters for the background pattern can be kept under control.

A yet further object of the present invention is to work out a method and a system to form microstructures, by means of which a surface modification can be achieved either via ablation or via photochemical etching if suitably selected materials, parameters and properly tuned energy density during the illumination are used.

A yet further object of the present invention is to work out a method and a system to form microstructures, by means of which nanometer sized concave objects can preferentially be fabricated on a substrate surface which can be transformed into convex objects by further processes.

Upon experimental and theoretical considerations, we concluded that a possibility for achieving the above objects is to provide a periodic intensity modulation and a near-field enhancement (that is, increase in intensity) simultaneously when microstructure formation takes place. It is highly advantageous if said periodic intensity modulation is provided in the form of an illumination that is realized by an interference pattern generated by monochromatic light. Combining interference lithography with colloid sphere lithography according to the invention, as well as carrying out the thus obtained novel type lithographic method allow near-field concentration of the periodically modulated intensity distribution. In the presence of the colloid spheres, near-field enhancement appears behind the colloid spheres in accordance with the pattern determined by the symmetry and periodicity of the interference modulation but in surface regions that have a size which is much smaller than the illumination wavelength. Since all colloid spheres illuminated with the intensity maxima of the interference pattern lead to near filed enhancement, the relative (inter-object) distance t of the nano-objects fabricated along directions defined by the maxima concerned will be determined by the diameter d of the colloid spheres; the actual value of this distance, however, will depend on the (relative) orientation of the interference pattern with respect to the monolayer of the colloid spheres. In turn, the distance between parallel lines of the nano-objects fabricated can be set (and/or, optionally, is scalable) by a periodicity p of the interference pattern, independently of said distance t. At the same time, our studies also showed that, from the viewpoint of performing the combined lithographic method according to the invention, making use of polarized light is preferred, too.

Here, and from now on, the relative orientation of the interference pattern and the colloid sphere monolayer applied onto the substrate surface is characterized by angles with respect to the (1,0,0) direction defined by the spheres of the monolayer arranged in hexagonal pattern. The angle between the plane of incidence and said (1,0,0) direction is denoted by α, the angle between the interference maxima and said (1,0,0) direction is denoted by β, while the angle between the in-plane projection of the E-vector of linearly polarized beams providing the illumination and said (1,0,0) direction is denoted by δ. It is noted that for the most simple case of two-beam interference $\beta=90°-\alpha$, for S-polarized light $\delta_S=\beta$, for P-polarized light $\delta_P=\alpha=90°-\beta$, and for the so-called azimuthal angle, which is the angle between a lattice generated by light and the plane of incidence, $\gamma=90°$ holds in every case. An angle of incidence θ of the illumination light corresponds to the so-called polar angle which is the angle between the incident beams and the direction vector of the substrate surface.

In particular, various complex structures can be fabricated by using the technique according to the invention. That is, in case of the two basic structures obtained by making use of e.g. two-beam interference and characterized by mini-mal distances, as it is illustrated in FIG. 1, (I) when the colloid spheres are illuminated in a "closed in-line" arrangement (that is, wherein said spheres contact each other), the inter-object distance $t^{(I)}$ of the nano-objects fabricated corresponds to the diameter of said colloid spheres, that is $t^{(I)}=d$, while the distance between parallel lines of said nano-objects, i.e. the inter-array distance, defined by the relation $$p_m^{(I)} = m \cdot \frac{\sqrt{3}}{2} \cdot d,$$

for m≥2 (m positive integer) values, differs from the respective inter-array distance that can be obtained for homogeneous illumination; here the angles characteristic of the relative orientation are as follows: $\alpha^{(I)}=90°$, $\beta^{(I)}=0°$; for S-polarized ($E_S$) light $\delta_S^{(I)}$ light=0°, while for P-polarized ($E_P$) light $\delta_P^{(I)}=90°$; and (II) when the colloid spheres are illuminated in a "closed inter-line" arrangement, the inter-object distance $t^{(II)}$ of the nano-objects formed by illumination exceeds the diameter of the colloid spheres, that is $t^{(II)}=\sqrt{3}\cdot d$, while the inter-array distance $p_m^{(II)}$ between parallel lines of said nano-objects can be varied by the angle of incidence of the interfering beams in harmony with the relation $p_m^{II}=m\cdot d$; for m≥2 (m positive integer) values this periodicity differs from the respective inter-array distance that is obtainable for homogeneous illumination; here the angles characteristic of the relative orientation are as follows: $\alpha^{(II)}=60°$, $\beta^{(II)}=30°$; for S-polarized ($E_S$) light $\delta_S^{(II)}=30°$, and for P-polarized ($E_P$) light $\delta_P^{(II)}=60°$.

Through the combined interference/colloid sphere lithographic method according to the present invention, the degree of freedom arising in nano-object fabrication, that is, the number of different geometrical parameters tunable independently of one another can be maximized. In case of structures forming upon illuminating surfaces by beams of periodic intensity distribution, said parameters are comprised of a mezoscopic characteristic length given by the periodicity $p_m^{(i)}$ (i=I, II, ...) that depends on the relative orientation of the interference pattern and the monolayer, a microscopic characteristic length given by the inter-object distance $t^{(i)}$ (i=I, II, ...) that is determined essentially by the diameter d of the colloid spheres, and a diameter $a^{(i)}$ (i=I, II, ...) which is determined by near-field intensity distribution and in most cases is smaller than the illumination wavelength. The size of the nano-objects fabricated—especially in case of metallic spheres—may depend on the relative orientation of the interference pattern and the colloid sphere monolayer used during the illumination, as said orientation influences the coupling between the colloid spheres that has, in turn, effects on near-field intensity distribution.

Due to the above three degrees of freedom provided by the novel type lithographic technique according to the invention, the parameters of in-plane (i.e. 2D) nano-object patterns can be tuned simultaneously in a broad range that is not accessible in case of the prior art processes. Furthermore, when the inventive methods to be discussed later in detail are used to fabricate volume (i.e. 3D) structures, an additional parameter, the Talbot length $D_n$ representing a yet further degree of freedom being tunable independently of said former parameters adds to the list of available parameters; its definition and further characteristics can be found e.g. in a paper by H. F. Talbot (Philos. Mag. 9, No. IV (1836)) and/or in a publication by W. Wang et al. (for further details the reader is referred to Opt. Comm. 260, pp. 415-419 (2006)); in the above respect, these papers are considered to form part of the present disclosure.

It should also be noted here, that besides the above three (in 3D four) parameters tunable independently of one another and can be exploited when a microstructure is fabricated according to a devised pattern, a yet further degree of freedom is also available: even in case of homogeneous illumination, the usage of polarized beams might result in the formation of a fine structure with a characteristic size much smaller than the illumination wavelength. Consequently, as synergetic effect, further patterns that can be characterized by even smaller characteristic sizes $d_0$ may develop inside the nano-objects (e.g. holes) formed in-plane or in the bulk. Said fine structure is determined collectively by the nature of the polarization, the wavelength λ which determines the size a of said nano-objects, as well as the diameter d and the dielectric properties of the colloid spheres—hence, the size $d_0$ and thus the symmetry of the internal structure can be tuned by the above parameters and simultaneously with their tuning. For metallic spheres, the fine structure that forms is much more robust and depends on polarization, wavelength and sphere diameter in a more sensitive way. Specifically, if the illumination takes place with circularly polarized light, an intensity distribution of circular symmetry builds up below the metallic colloid spheres in the annular region between the center and the rim of each sphere. If, however, the illumination takes place with a linearly polarized light, an intensity distribution dipolar along the oscillation direction of the E-field forms in said region. This structure is rotatable even in case of homogeneous illumination: for a given plane of incidence ($\alpha$ is constant), by tuning the direction $\delta$ of the polarization or for a given polarization direction ($\delta$ is constant), by altering the plane of incidence, i.e. by tuning angle $\alpha$. Hence, the additional degree of freedom becomes available in the novel type integrated lithographic technique according to the present invention due the fact that when the angle $\delta$ (which is the angle between the in-plane projection of the E-vector and the (1,0,0) direction) is being varied, the orientation of the fine structure with respect to the interference pattern also changes.

Since this "internal" intensity modulation leading to the formation of a fine structure appears in a range of much smaller scale than the above parameters p, d and a, the phenomenon itself can be either enhanced or even suppressed by making use of a photoresist material with appropriate threshold of sensitivity to light. When using dielectric spheres, a fine structure with less contrast can be achieved.

Thus, by selecting suitable materials, pattern and nano-object parameters, the combined interference/colloid sphere lithographic technique according to the invention allows to fabricate 2D/3D microstructures with pre-designed artificial spectra or to modify other spectra as desired. The devised spectrum engineering can be performed with three degrees of freedom (or rather with four, if the parameter $d_0$ associated with the fine structure as discussed above is also considered) when inscribing into a surface is effected, and—as a consequence of the Talbot length—with four (or rather five) degrees of freedom when writing into the volume of a bulk material; in lack of appropriate techniques in prior art, this could not be achieved previously.

The technique according to the invention is suitable essentially to create concave objects—i.e. for example nano-holes—that can then be transformed into convex objects—that is, e.g. nano-particles—arbitrarily via per se known further techniques, by e.g. lift-off processes. This represents a further advantage of the inventive technique in respect of its practical applications. Our studies, however, have shown that concave patterns are more promising in the field of spectrum engineering, since there is only a weak dipole coupling between the metallic nano-particles, but localized plasmons induced within the nano-holes are strongly coupled via the SPP modes propagating over continuous films.

In particular, the object related to the enabling of spectrum engineering/modification in a devised manner is achieved by providing novel microstructuring methods.

In what follows, the invention is discussed in more detail with reference to the attached drawings, wherein FIG. 1 illustrates schematically two typical and also the simplest type (I) and (II) orientations of an arbitrary illumination interference pattern and a colloid sphere monolayer influencing the imaging relative to one another, with also the orientations relative to the (1,0,0) direction;

FIG. 2 is a diagrammatic representation of a possible embodiment of the setup for accomplishing the combined interference/colloid sphere lithographic method according to the invention in a perspective view with two-beam interference illumination of the colloid sphere monolayer and with using an aluminum oxide ($Al_2O_3$) mask in the process of fabricating and then transforming a 2D microstructure of concave holes into a pattern of convex nano-particles;

Figure 10:
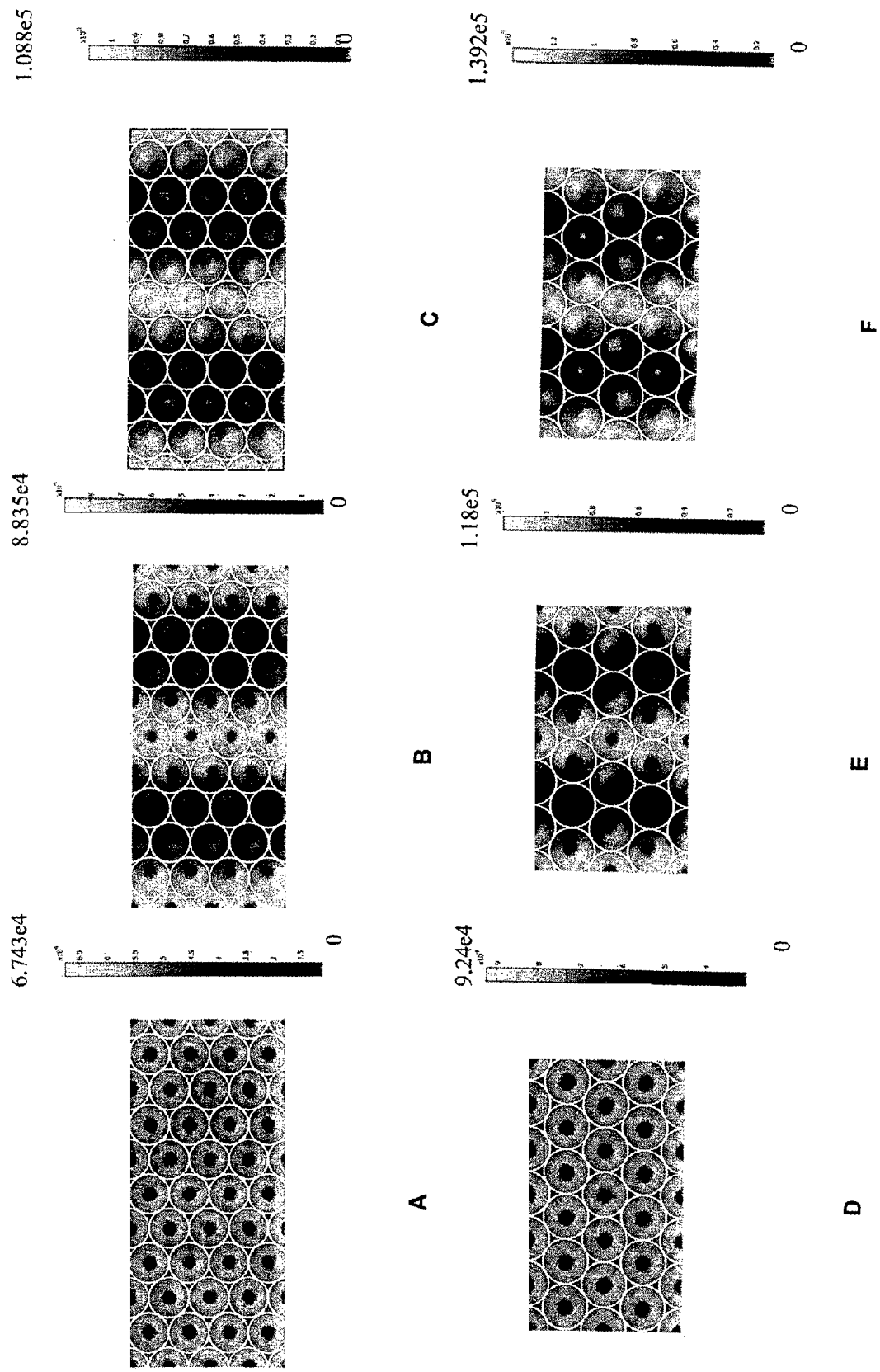
Figure 11:
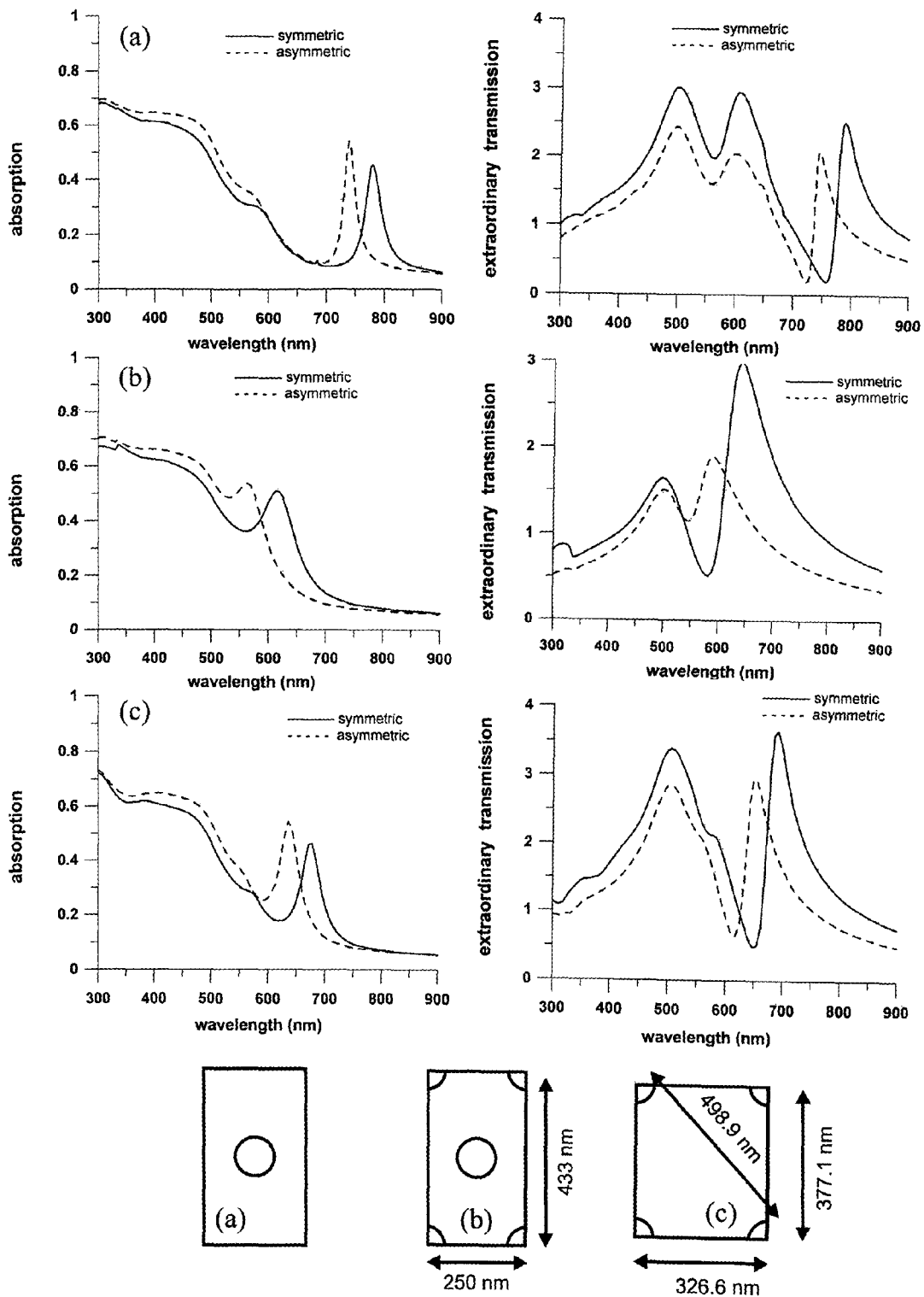

FIGS. 6 to 9 show simulation results for the effect of gold (FIGS. 6, 7, 9) and quartz (FIG. 8) colloid sphere monolayers arranged on substrate films made of gold (plots A, B, D, E) and polycarbonate (plots C, F) on the intensity distribution due to illumination in the direction of propagation of the linearly polarized illuminating light beam in a plane located just behind the spheres (that is, practically on the substrate surfaces to be structured);

FIG. 10 illustrates simulation results for the effect of gold colloid sphere monolayers arranged on substrate films made of gold (plots A, B, D, E) and polycarbonate (plots C, F) on the intensity distribution due to illumination by circularly polarized light; and FIG. 11 shows the influences of the geometrical parameters on the spectrum in case of thin metal films structured by means of homogeneous illumination and by the combined interference/colloid sphere lithographic method according to the invention.

The core feature of the combined interference/colloid sphere lithographic method according to the invention is that during fabrication of the microstructure in practice the intensity modulation providing the periodic pattern and the near-field intensity enhancement are provided simultaneously. To this end a colloid sphere monolayer arranged on a proper substrate is illuminated by a spatially modulated beam, preferably in a synchronized manner. Said beam, if possible, is provided in the form of a single laser pulse with appropriate energy density. Spatial modulation of the illuminating beam is induced via interference. To this end, the illuminating beam is split into at least two portions by means of a suitable beam-splitting device (e.g. a diffraction grating) in a per se known manner. Then, the illuminating beam of spatially modulated intensity distribution (that is, the one corresponding to the desired interference pattern) is generated by combining the beam portions after they traveled over light paths of various lengths. The thus obtained illuminating beam is then made to strike said spheres of the colloid sphere monolayer at a given angle. In this way, the monolayer of the colloid spheres is illuminated with a light beam which is periodically modulated as to its intensity distribution.

Figure 1:
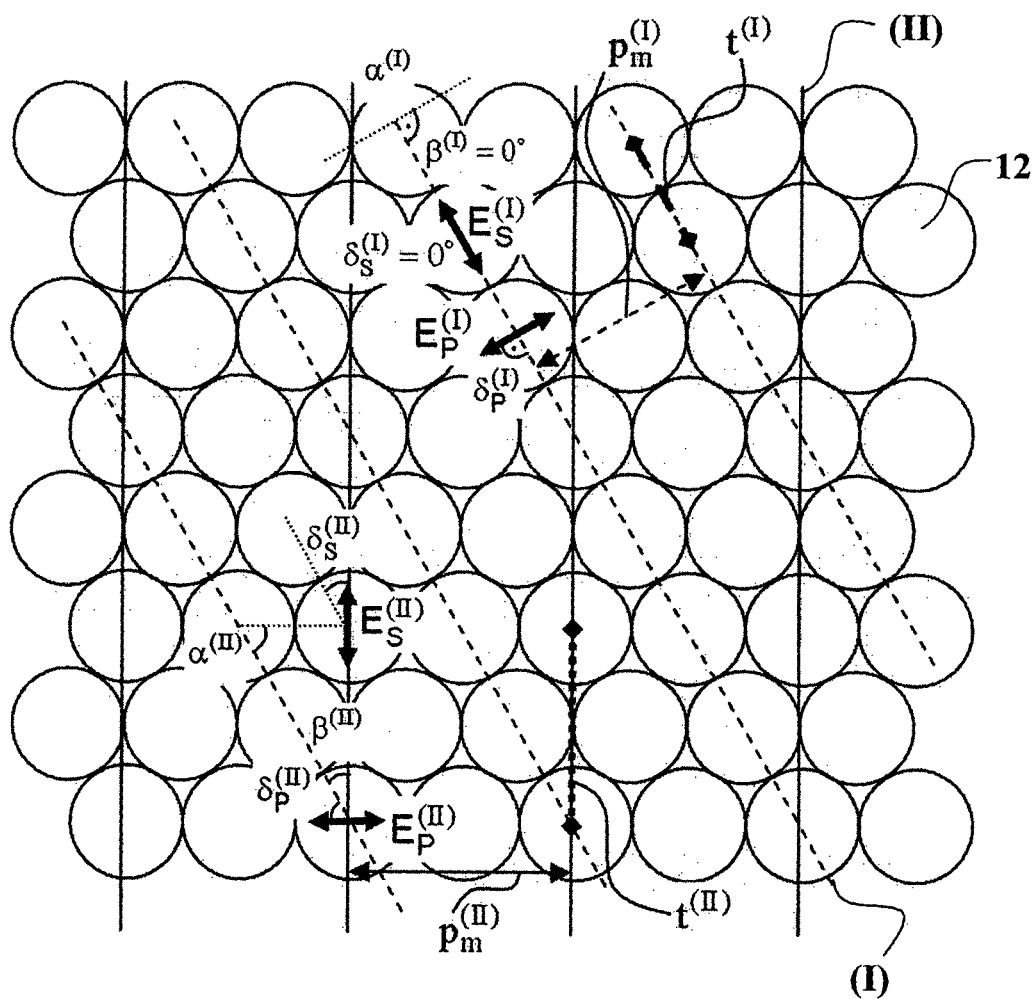

As it is shown in FIG. 1, the angle of incidence $\theta_m^{(i)}$ (i=I, II . . . ), here m is a positive integer, of the illuminating beam that is formed with the normal to the plane of surface (i.e. the incidence norm, not shown, perpendicular to the plane of paper in this Figure) carrying a monolayer 12 can take such discrete values defined by the wavelength $\lambda$ of the illuminating light and the diameter d of the colloid spheres that are suitable for structuring. Said discrete values of the angle of incidence $\theta_m^{(i)}$ are also influenced by the relative orientation of the colloid sphere monolayer and the illuminating interference pattern. In particular, in case of a type (I) orientation illustrated in FIG. 1, for the so-called "closed in-line" arrangement that results in the illumination of colloid spheres located beside and in contact with one another in pairs, that is apart from one another by the distance $t^{(I)}$=d, said values of the angle of incidence $\theta_m^{(i)}$ can be calculated from the equation $$\theta_m^{(I)} = 2 \cdot \arcsin\left(\frac{\lambda}{m \cdot \sqrt{3} \cdot s}\right).$$

At the same time, in case of the type (II) orientation shown in FIG. 1, that is, for the "closed inter-line" arrangement that results in objects located apart from one another by the distance $t^{(II)}=\sqrt{3}\cdot d$, the values of said angle of incidence $\theta_m^{(i)}$ can be calculated from the equation $$\theta_m^{(II)} = 2 \cdot \arcsin\left(\frac{\lambda}{2 \cdot m \cdot d}\right).$$

For dielectric spheres, the value of the above angles of incidence $\theta_m^{(i)}$ (i=I, II) can range from relatively small angles preferably to at most 60°, more preferably to at most 45°; above 60°, the adjacent spheres of the colloid sphere monolayer modify the intensity distribution in an angle-dependent and hardly controllable manner. At the same time, for metallic spheres, the angle of incidence can even range up to 90° that corresponds to the case of normal incidence; the coupling between adjacent spheres might induce an advantageous increase in intensity, the extent of which can be optimized via the geometrical parameters. Moreover, in case of illuminating beams that are polarized, the intensity distribution exhibits a fine structure that depends on the type of polarization.

To generate an illuminating beam with spatially modulated intensity distribution, interference creating methods known from interference lithography can be used, such as e.g.—without completeness—the techniques of two-beam interference, multi-beam interference, coherent optical imaging or coherent diffraction. These techniques are discussed in detail in literature (see e.g. the above cited scientific publications), thus in what follows they will be treated only in brief and for the details, the reader is referred to the papers mentioned above.

Figure 2:
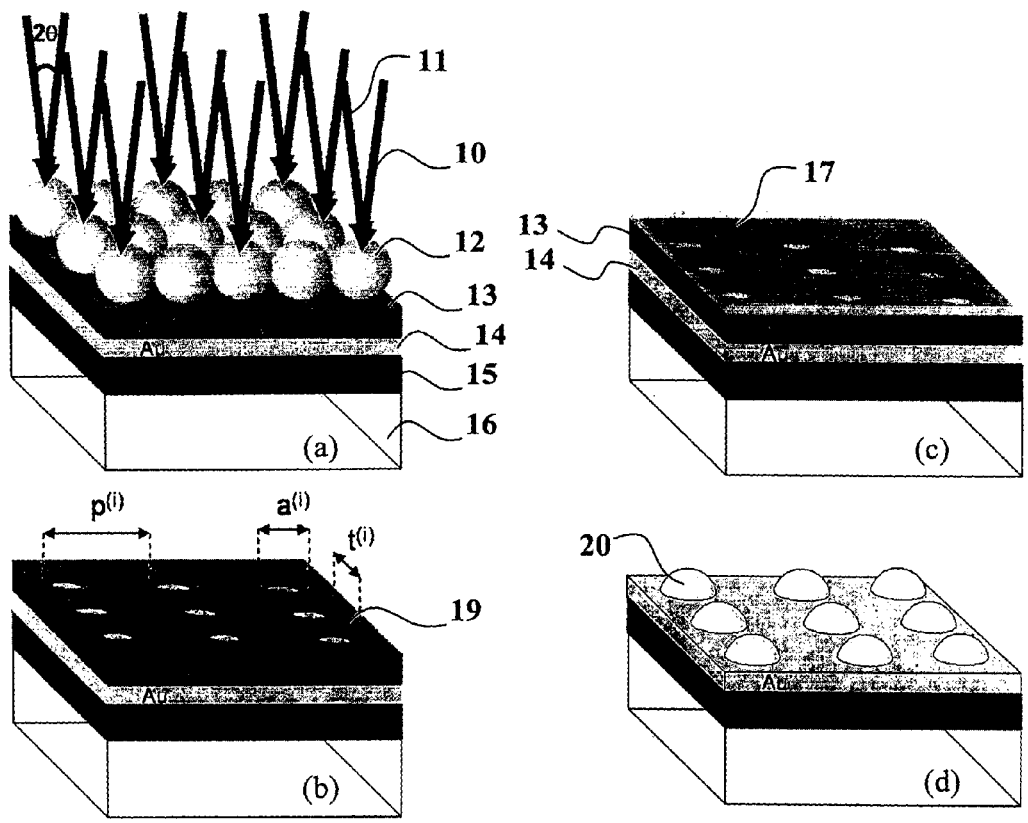

FIG. 2 shows the two-beam interference illumination of a colloid sphere monolayer to fabricate, if desired, a surface metallic microstructure. To this end, as a start, a thin film 15 made of silver (Ag) having a small full width at half maximum (from now on FWHM) on the resonance curve for plasmonic excitations was previously formed on one side of a substrate 16 made of glass of optical quality with a large area, preferably in the order of dm² in magnitude to be structured, and then a thin film 14 made of gold (Au) is formed on said Ag thin film 15 by a suitable physical layer producing method known by the person skilled in the art. Then, said Au thin film 14 is coated by a thin film 13 made preferably of e.g. aluminum oxide or anodised aluminium of even thickness. Then, a monolayer 12 of Stöber-type colloid spheres is formed on the exposed surface of the latter by means of e.g. the already mentioned Langmuir-Blodgett technique (an outline of the basis of this method can be found e.g. in the paper by Stöber et al.; see J. Colloid Interf. Sci. 26, p. 62 (1968)). It is noted here that the Ag thin film 15 is merely used to optimize the plasmonic effect (i.e. to ensure a small FWHM) to be exploited; the method can be completed with similar results if the Ag thin film 15 is replaced by a different metal, for example by gold or by a multilayer built up of several different metals.

The thus obtained structure (see FIG. 2(a)) is then subjected to the microstructuring method according to the invention. In a variant of said method, light emitted by a laser source emitting at a central wavelength falling into the ultraviolet (UV) range is split into two beams 10, 11 in a known manner and by means of known devices. The monolayer 12 is illuminated with light having spatially modulated intensity distribution obtained by interfering incident beams 10, 11 closing an angle of 2θ with one another after they have traveled appropriate paths. As the laser light source, for example ArF lasers (at $\lambda_0$=193 nm) can preferably be used, however, depending on the material of the substrate and the colloid spheres, lasers emitting at other wavelengths are equally applicable for this purpose. In case the monolayer 12 with hexagonal symmetry here and the interference pattern obtained by the two-beam interference are matched/synchronized properly to one another (the details are given below), simultaneous existence of the modulation in intensity establishing the periodic pattern and near-field enhancement will be ensured behind the monolayer 12 in the propagation direction of said beams 10, 11. When illuminating, the interference pattern is practically focused into the thin film 13 by the quartz colloid spheres arranged in a periodic pattern in said monolayer 12, and thereby—if the interference pattern is of suitable intensity—a periodic microstructure according to FIG. 2(b) is fabricated in said thin film 13 via ablation or photochemical etching induced by said illumination.

The thickness of each individual metal layer within the system of thin films made use of in harmony with FIG. 2(a) to fabricate the desired microstructure is preferably in the same order of magnitude as a thickness that results in plasmon resonance at the wavelength of light applied for a spectral investigation. For noble metals (for example Au, Ag), the values of said thickness are typically about 40-50 nm for wavelengths in the visible range. Furthermore, in most cases the thickness of thin film 13 is preferably at most several ten nanometers, more preferably about 10-50 nm.

Holes 19 of the microstructure fabricated within the thin film 13 are arranged in a planar periodic pattern in accordance with FIG. 2(b). Characteristic geometrical parameters of said periodic pattern comprise a first length defined by the periodicity $p_{m\geq 2}^{(i)}$ (i=I, II . . . ) of the interference pattern, the value of which is given by the relation $p_{m\geq 2}^{(i)}=\lambda/2 \sin(\theta_m^{(i)}/2)$ (i=I, II . . . ) wherein $\lambda$ and $\theta_m^{(i)}$ stand for the wavelength of the illuminating light and the orientation-dependent angle of incidence, respectively; a second length $t^{(i)}$ (i=I, II . . . ) in the form of a distance determined by the diameter d of the quartz spheres; as well as a third length that can be described as the dimension/diameter $a^{(i)}$ (i=I, II . . . ) of an object in said microstructure and is collectively determined by the wavelength, the diameter of the quartz spheres and the near-field intensity distribution.

As the intensity distribution of light used for the structuring is spatially modulated (i.e. the intensity maxima and minima of constructive and destructive interference, respectively, follow each others periodically and located apart from one another in the interference pattern by a distance commensurate with the wavelength of light), the planar microstructure created exhibits different periodicities along the orthogonal directions of its plane, since the relation $t^{(i)} \neq$ (i=I, II . . . ) always holds. Nevertheless, the diameter a of the individual objects in the microstructure fabricated is determined by near-field effects, as is typical for colloid sphere lithography, and thus $p^{(i)} \gg a^{(i)}$. It is noted that by the method according to the invention sufficiently large energy density can be provided in the region behind the monolayer 12 to ablate, along with the thin film 13, the quartz colloid spheres of the monolayer 12 as well. Whether or not this takes place depends on the ratio of the ablation thresholds of said two layers.

After this, to prepare desirably a metallic surface microstructure of particle type, dome-shaped nanosized objects 20 (nano-particles) can be fabricated (see FIG. 2(d)) by applying a yet further thin film 17 on the surface of the previously structured thin film 13 via vapour deposition (see FIG. 2(c)) of e.g. gold, and then by removing said thin film 13 via suitable chemical etching processes (e.g. by performing a chemical etching with sodium hydroxide (NaOH)). Here, the obtained surface microstructure comprises a periodic pattern of golden hemispheres in the order of about 10-100 nm in diameter. It is noted that similar surface structures can be fabricated via similar processes from any other metals compatible with gold, e.g. from silver, aluminium, copper and, furthermore, instead of said hemispheres, for example cylindrical objects can also be fabricated.

To perform illumination with the above exemplified two-beam interference pattern, UV laser pulses of ns or fs in duration are equally apt, as here the dielectric layer was structured in the first step. Laser pulses of the same properties can also be used to provide illumination in the form of a multi-beam interference pattern.

Figure 3:
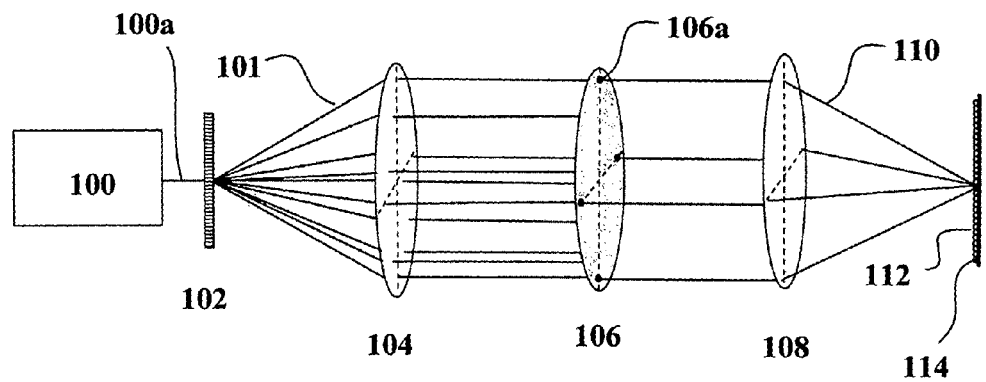
FIG. 3 is a diagrammatic representation of a possible further embodiment of the setup for accomplishing the combined interference/colloid sphere lithographic method according to the invention in a perspective view with illuminating the colloid sphere monolayer by means of coherent optical imaging to fabricate 2D microstructures of various symmetries.

For direct structuring of metals, short pulsed lasers are more preferable. FIG. 3 illustrates diagrammatically a further variant of the method according to the invention with a short pulsed light source, wherein illumination of the colloid sphere monolayer takes place by coherent optical imaging. The setup shown schematically corresponds basically to a setup for confocal lithography. Accordingly, light 100a emitted by a coherent light source 100 is directed into a light path in which a beam-splitting optical element 102 is arranged. The light source 100 comprises preferably a pulsed fs laser. As beam-splitter, preferably diffraction based optical elements, in particular an amplitude or a phase grating are applied. By means of the beam-splitting optical element 102 beams 101 propagating in various directions are generated which are then focused by a focusing optical element 104 onto an aperture element 106. The focusing optical element 104 comprises preferably a condensing lens of suitable dimension and focal length. From amongst the beams striking the aperture element 106, beams of desired amount can be filtered out by means of apertures 106 formed in the aperture element 106.

In the embodiment shown here, four passing beams are used that are by four apertures 106a formed at angular positions of 90° relative to one another; the apertures 106a may, however, define a transmission pattern of arbitrary symmetry. Phase matching of each beam is achieved by introducing optical retarders (dispersive elements, e.g. series of prisms, made of dielectric material transparent at the illumination wavelength that result in phase shift; not shown in the drawings) into the light path.

The beams selected by the aperture element 106 are then focused as illuminating beams 110 by the focusing element 108 arranged in the light path onto a colloid sphere monolayer 112 (shown not to scale in the drawings) formed on a substrate 114, and by illuminating the colloid spheres the desired microstructure is fabricated in the manner discussed already in relation to FIG. 2. The focusing element 108 comprises preferably a condensing lens of suitable dimension and focal length. The symmetry and the periodicity p of the thus obtained microstructure are determined by the angle formed by said beams, the phase difference between the beams, as well as the extent of scaling-down accessible in the setup. For multi-beam interference, different characteristic lengths can arise together in different spatial directions. If the illumination takes place, in particular, with light of a given polarity, the type of polarization (S- or P-) also influences the symmetry relations of the microstructure. In general, the type of polarization also influences the nature of intensity distribution at the level of the interference pattern and the fine structure.

When the colloid sphere monolayer is illuminated specifically with light having spatially modulated intensity distribution obtained via two-beam interference, in view of the above, complex 2D microstructures can be fabricated that are built up of objects (i) that are located apart from one another by a distance $t^{(i)}$ (i=I, II . . . ) falling into the order of 1 µm (1000 nm)/sub-µm (100 nm) of diameter d of the colloid spheres and also have a dimension $a^{(i)}$ (i=I, II . . . ) falling into the order of sub-µm (100 nm)/nm (1-10 nm) in a certain first planar direction, and (ii) can be characterized by a periodicity $p^{(i)}$ (i=I, II . . . ) falling into the order of the wavelength of light used for the illumination (i.e. 100-1000 nm) in a planar direction perpendicular to said first direction, as it can be seen e.g. in FIG. 2 for the case of $t^{(I)}=d$.

When the colloid sphere monolayer is illuminated with light having spatially modulated intensity distribution generated via interfering more than two laser beams or obtained by coherent optical imaging (see e.g. the confocal arrangement of FIG. 3), complex 2D microstructures built up of objects having a dimension $a^{(i)}$ of sub-µm (100 nm)/(1-10 nm) but with a symmetry of higher order. The objects of the microstructures equally comprise holes or particles, for example hemispheres, cylinders, to be formed by per se known techniques. Moreover, individual (metallic) objects of various microstructures that can be fabricated by the method according to the invention modify the absorption and/or emission (and corresponding transmittion) spectra of the substrate via interacting with one another or with their environment (through e.g. surface plasmons excited on metallic films), and thus can be used to induce a predefined type of change in said spectrum/spectra. Therefore, the combined interference/colloid sphere lithographic method according to the present invention is eventually suitable for fabricating structures with desired spectra.

Figure 4A:
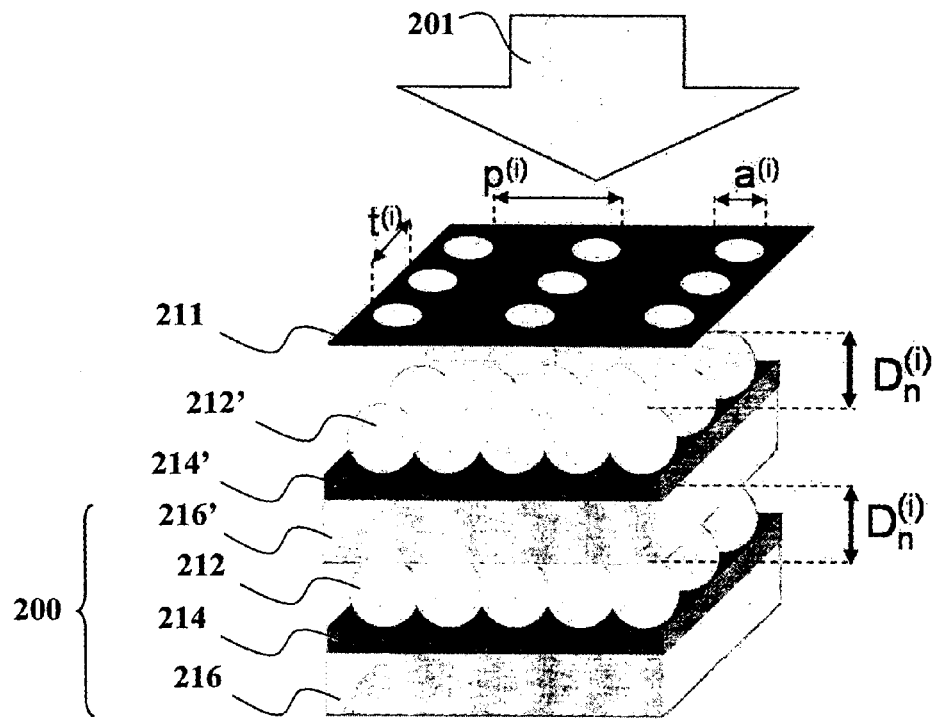
FIG. 4A is a diagrammatic representation of a possible yet further embodiment of the setup for accomplishing the combined interference/colloid sphere lithographic method according to the invention in a perspective view with illuminating the colloid sphere monolayer by means of coherent diffraction to fabricate a 3D microstructure, in particular in the structuring process of a bulk material.
Figure 4B:
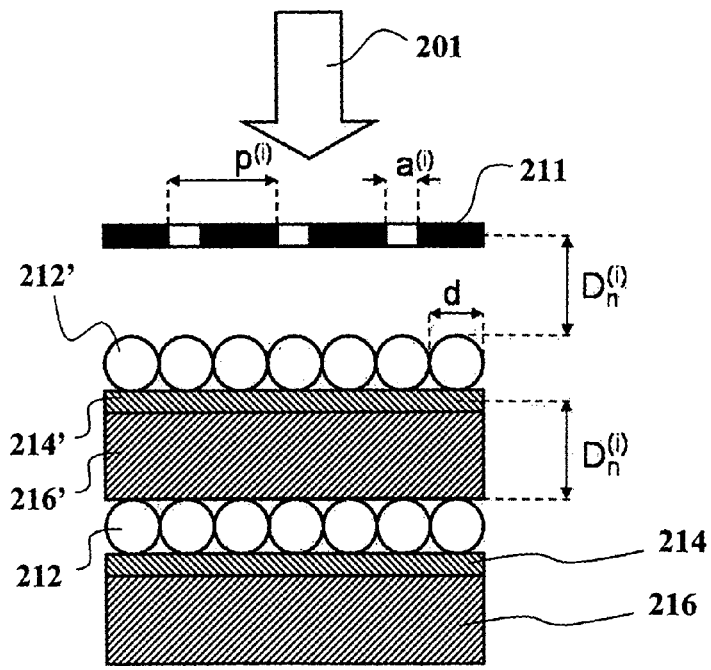
FIG. 4B illustrates the structuring shown in FIG. 4A in a plane section parallel to the plane of incidence.

FIGS. 4A and 4B illustrate schematically a yet further variant of the method according to the invention for volume structuring of a bulk material 200, wherein the so-called self-imaging effect is exploited. The essence lies here in the fact that when a mask 211 with periodic patterns is illuminated with a coherent light beam 201, diffraction appears on said mask 211 and as a consequence of the interference of the diffracted beams, the image of the mask 211 shows up at the so-called Talbot-lengths ("writing in") expressed by $D_n^{(i)}=np$ $^{(i)2}/\lambda$ (here, n is an integer number, $p^{(i)}$ denotes the in-plane periodicity of the individual diffracting objects within the periodic pattern, and $\lambda$ stands for the illumination wavelength). The mask 211 concerned can be prepared e.g. by means of the above discussed two- or multi-beam interference or coherent optical imaging. It is noted, that the superscript (i) here collectively refers to several possible pairing and relative orientation of the mask and the colloid sphere monolayer. FIG. 4A shows a specific case, wherein the relative distance $t^{(i)}$ between the holes corresponds to the diameter d of the colloid spheres in the monolayer. The holes are arranged along a direction parallel to the (1,0,0) direction, the illumination is similar to the one generated by two interfering beams in the so-called "closed in-line" arrangement (that is, i=I). It makes a basic difference, however, that in the present case, intensity modulation is also present along the series of holes, i.e. along the (1,0,0) direction. It is also noted that either Talbot length $D_n^{(i)}$ can be used for the volume microstructuring at issue (however, for higher orders of "n", distortions might appear), and when the initial position of the mask is corrected, it might become necessary to monitor said higher orders as well.

Volume or 3D structuring of the bulk material 200 can be accomplished basically in two ways; the deep structuring at issue may take place (i) by advancing from layer to layer sequentially or (ii) by a full transillumination from top to bottom. To illustrate said 3D structuring, a mask/colloid sphere pairing and an orientation that correspond to the respective one in e.g. FIG. 4A are chosen. The illumination is provided preferentially by a perpendicularly incident light beam 201.

In case of sequential structuring, a sandwiched structure comprising a film 214 to be structured and applied onto a substrate 216, as well as a colloid sphere monolayer 212 formed on said film 214 is arranged separated from the mask 211 preferably by just a Talbot length in a sample chamber (not shown in the drawing; suitable for layer deposition). Then, by illuminating the spheres in said colloid sphere monolayer 212 through the mask 211 with a coherent light beam 201 perpendicularly, a copy image of said mask 211 is "written into" the film 214 of high absorption applied onto the substrate 216. Said film 214 may comprise any metal that absorbs at a certain wavelength. After this step, a consequential sandwiched structure comprised of a substrate 216'/a film 214' to be structured/a colloid sphere monolayer 212' is formed on the colloid sphere monolayer 212, preferably without removing the structure obtained earlier as a result of the previous step from the layer deposition sample chamber. Optionally, spheres of the colloid sphere monolayer 212 of the previously formed sandwiched structure are removed before applying a subsequent sandwiched structure. Then, by illuminating the spheres in the colloid sphere monolayer 212' with the coherent light beam 201 through the current mask, a copy image of the mask is "written into" the film 214' that forms part of the sandwiched structures prepared just before. Then, the sandwiched structure discussed above is formed again on the exposed free surface of the previously obtained structure, and then the writing-in step is performed. In this way, by repeating the steps of "applying a sandwiched structure" and "writing in" sufficiently many times in turn, the bulk material 200 with the desired structure will be obtained in the sample chamber with an effective 3D dimension. Due to the interactions of the objects in the microstructures fabricated as part of the bulk material 200 itself, the absorption/emission (and corresponding transmission) spectrum of the thus produced bulk material 200 is prepared/modified (i.e. engineered) in a predefined manner.

It is noted that during the sequential preparation of the above 3D structure, the colloid spheres in the monolayers located below one another can be vertically synchronized in the following way: by means of the initial mask 211, a template is prepared in a thin (photo)resist layer that will define the locations of the colloid spheres in the monolayer to be applied in the next step. A controlled rotation of the initial mask 211 enables a predefined rotation of the template as well, and thus—if a perfect vertical alignment/coincidence is not a requisite for successive series of holes—it becomes possible to arrange patterns of holes rotated relative to each others vertically upon one another.

In case of deep structuring via full transillumination from top to bottom, as a start, a bulk material 200 to be structured is prepared in the form of a sandwiched structure of the film 214/214' applied on the substrate 216/216' and the colloid spheres of the colloid sphere monolayers 212/212' layered in turn upon one another. In this bulk material the colloid spheres belonging to different monolayers located below one another have to be aligned vertically which is assured by means of templates written in by the mask 211 initially. As a next step, the mask 211 is arranged apart from the first free face (structuring will take place through this) of the bulk material 200 by a Talbot length in the propagation direction of the light beam 201, and is then illuminated with the coherent light beam 201 from top to bottom. There is no contact between said mask 211 and the colloid spheres 212', but as a result of the coherent diffraction an image of the mask 211 forms within a plane spanned by the apices of said colloid spheres 212'. The colloid spheres in the monolayer 212' focus this intensity distribution into the film 214' to be structured (that is, to be provided with a desired microstructure), as a consequence of which a secondary mask forms within the film 214' of said bulk material 200. The periodicity $p^{(i)}$ and the distance $t^{(i)}$ (i=I, II . . . ) measured along the series of holes in the periodic pattern essentially conform with the respective parameters of the mask 211, however, the dimension $a^{(i)}$ may differ from the diameter of the holes of the original mask 211. In the next step of writing in this secondary mask will serve as the mask.

If the original mask 211 is removed and immersion fluid is introduced in a suitable way into between the colloid spheres of the first colloid sphere monolayer 212' in the propagation direction of the illuminating light beam 201, the lens effect ceases and an image of the series of holes thus formed through illumination will appear—as a mask—on the top of a subsequent colloid sphere monolayer 212 located apart from the mask prepared within the metallic film 214' by again a Talbot length. By this process two films 214' and 214 layered below one another can be perforated with the same periodicity p. Here, each of the films 214 and 214' comprises preferably a metallic thin film, however, they can be made of any other materials as well.

Deeper lying layers can be similarly illuminated, with a difference that the deeper located masks behind a mask formed by more than two series of holes above one another will be illuminated with a beam that has not a homogeneous intensity distribution, but a one which is determined by said mask and all the colloid sphere monolayers lying above said deeper located masks. It should be here noted that the light exposure of deeper lying masks can be changed as desired if, specifically, a liquid with an index of refraction differing from that of the material of the colloid spheres is introduced into around said colloid spheres within the colloid sphere monolayer 212'.

Besides realizing 3D structuring of a bulk material by the above process, when the masks are illuminated with laser pulses of fs in duration, the distortion experienced generally at higher order Talbot lengths $D_n^{(i)}$ (that is, for n>1) can be eliminated as well. It is also noted that said Talbot length, that appears when 3D structuring of the bulk material is carried out, provides an additional characteristic length (which falls essentially into the range of 100-1000 nm) and, therefore, in these cases four pieces of independent and free geometrical parameters are accessible when spectrum modification is executed in practice. It is also noted that if the illumination is performed with polarized light, the objects of the microstructures fabricated within the bulk material may optionally exhibit a fine structure characterized by an additional characteristic length $d_0$ that is smaller than the above parameters and, hence, the number of free geometrical parameters accessible for the spectrum modification increases to five.

Figure 4C:
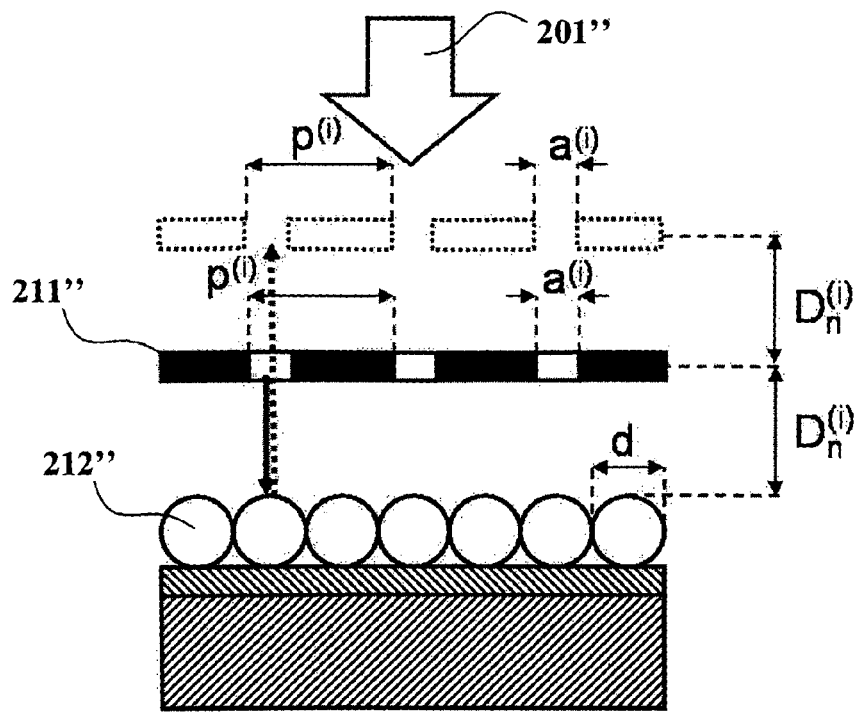
FIG. 4C shows a concept of synchronizing the intensity modulation generated by the multilayer of FIG. 4B and the mask.

When the 3D structures are created by deep structuring performed from top to bottom, a synchronization has to be provided, according to FIG. 4C, between an interference pattern generated by a prefabricated mask 211" and the series of spheres of a colloid sphere monolayer 212". It is known that due to diffraction of a coherent beam 201" used for illumination, an image of the mask 211" will repeatedly form at several/higher order Talbot lengths. Thus, if said colloid sphere monolayer 212" is perfectly centered under the mask 211", the reflected beams will produce an image of the mask 211" in the propagation direction of said beam 201", at Talbot lengths, within the region located in front of the original mask 211" as well, which can be exploited at synchronization.

Figure 5A:
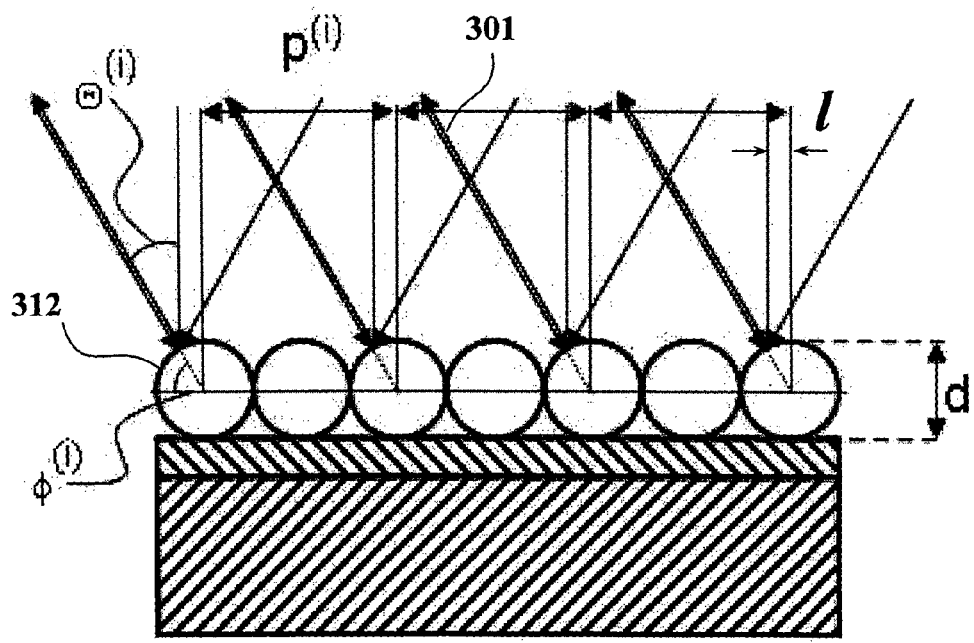
FIG. 5A shows a concept of rotational synchronization of an interference pattern obtained by a colloid sphere monolayer and two-beam interference.

As it was earlier mentioned, a core feature of the combined interference/colloid sphere lithographic method according to the invention is the matching/synchronization of the interference pattern used for illumination and the series of colloid spheres organizing in conformity with an in-plane hexagonal symmetry, the aim of which is to maximize the periodic intensity enhancement in near-field. A possible technical realization of said matching/synchronization is discussed in what follows in detail with reference to FIGS. 5A, 5B and 5C for the case of two-beam interference.

When practical realization is about, the primary task is to locate characteristic directions of a colloid sphere monolayer 312 arranged on a substrate in a macroscopic reference system. As the monolayer made of dielectric/metallic colloid spheres is a photonic-plasmonic crystal, there are always present characteristic extreme points in the reflection that depends on polar ($\theta^{(i)}$) and azimuthal ($\gamma$) angles. It is noted that the azimuthal angle $\gamma$ is the angle between the plane of incidence and the periodic pattern defined by illuminating said colloid spheres with the interference pattern. The extreme points concerned can be detected successfully at resonant wavelengths determined by the type of material and the size of the colloid spheres and the composition of the multilayer to be structured; these resonant wavelengths may differ from the wavelength used in the fabrication of the complex structure. To rotate the monolayer 312 into a well-defined/proper spatial direction, a further wavelength can be used as well.

Knowing the spatial orientation of the colloid sphere monolayer 312, the setup for effecting the illumination is rotated into a direction that corresponds to a relative orientation that can be characterized by orientation angles $\alpha^{(i)}$ and $\beta^{(i)}$ (i=I, II, ...) (see FIG. 1). As during illumination a periodic lattice in the order of the wavelength of the illumination is created/selected by the interference pattern itself, with a knowledge of the angle of incidence $\theta^{(i)}$ and the azimuthal angle $\gamma$, the directions of expectable diffraction orders can be determined. A rotational synchronization of the colloid sphere monolayer 312 and the interference pattern is accomplished via detecting said diffraction orders.

The core of the process used to perform the synchronization lies in that said dynamic lattice created by the light beam 301 used for illumination is in a so-called Littrow arrangement, as the condition $2p^{(i)} \sin \theta^{(i)} = m\lambda$ always holds for m=1. Thus, when during rotational positioning of the monolayer the incoming light beam 301 with an angle of incidence $\theta^{(i)}$ strikes at right angle on the surfaces of the individual colloid spheres in the series of colloid spheres apart from one another by a distance of the periodicity $p^{(i)}$ on either side, as a consequence of constructive interference, very large intensities can be detected in the reflected beam. Knowing the radius of the colloid spheres and the angle $\theta^{(i)}$, the distance $l^{(i)} = (d/2) \cos \Phi^{(i)} = (d/2) \sin \theta^{(i)}$ between a position satisfying the above condition and the center of the series of spheres, i.e. the extent of decentralization, can be determined on the basis of FIG. 5A. Intensity maxima appear alternately in beams reflected by a transparent planoparallel plate arranged in the light path of the illumination for a decentralization $\pm l^{(i)}$ relative to the center of the series of spheres. Based on this, the maxima of said interference pattern and the centers of said series of spheres in the monolayer can be brought into alignment via finely displacing the interference pattern generated by the light beam 301 and the colloid sphere monolayer 312 relative to one another, which represents a first step towards completing positioning/matching/synchronization.

Figure 5B:
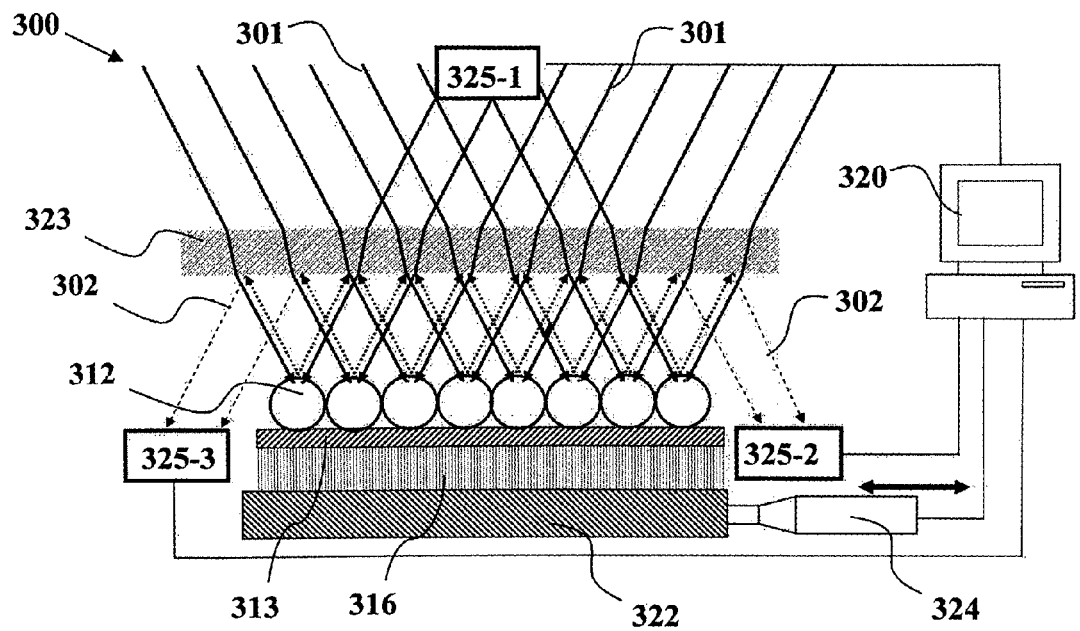
FIG. 5B illustrates schematically an arrangement for matching a colloid sphere monolayer and an interference pattern obtained by two-beam interference in e.g. the type (I) or type (II) orientation (see FIG. 1)

The arrangement for matching 300 in FIG. 5B comprises a main control unit 320, a stage 322 suitable for in-plane displacements, precision translators 324 to displace said stage 322 in-plane, as well as light intensity detectors 325-1, 325-2, 325-3. Said translators 324 and said light intensity detectors 325-1, 325-2, 325-3 are connected to the control unit 320, the connection is provided by an arbitrary link, either wired or wireless, also capable of realizing data transmission. The control unit 320 is preferably either a computer or any other similar suitable means (e.g. microcontroller, etc.), while said light intensity detectors 325-1, 325-2, 325-3 are provided preferably in the form of photodetectors/CCD cameras of appropriate resolution. A sample to be subjected to 2D or sequential 3D structuring by the method according to the invention is affixed on said stage 322; thus said sample is displaced together with the stage 322. Here, the sample is provided by a film 313 formed on the surface of a substrate 316 in combination with the colloid sphere monolayer 312 arranged on the surface of said film 313. The spatially modulated illumination generated by two-beam interference and to be matched with the series of spheres building up the colloid sphere monolayer 312 is provided by light beams 301 emitted by a coherent source of light (not illustrated in the drawing). One of the light intensity detectors 325-1, 325-2, 325-3, in this particular case for example a first light intensity detector 325-1 is arranged opposite to the sample on the stage 322 when considering in the direction of illumination and its sensing surface faces to said sample. The remaining two light intensity detectors 325-2, 325-3 are arranged beside the stage 322, preferably along two opposite sides of said stage, in such a position that their sensing surfaces lie in the same plane and face to the plane of the sensing surface of said first light intensity detector 325-1. Preferably, the common plane of the sensing surfaces of the light intensity detectors 325-2 and 325-3 corresponds to the plane of the surface of the film 313 on the substrate 316 to be structured of the sample arranged on the stage 322. In the present embodiment, a transparent element 323 is arranged in the light path defined by the light beams 301 between the first light intensity detector 325-1 and the stage 322. Said transparent element 323 is provided by e.g. a quartz plate that is translucent typically at the illumination wavelength, preferably in the UV range; geometrical parameters (e.g. thickness) of said element can be easily determined by a skilled person in the art.

Matching of the series of spheres in the colloid sphere monolayer 312 with the interference pattern used for the illumination takes place via detecting light reflected by said monolayer 312 which is carried out by the light intensity detectors 325-1, 325-2, 325-3. In particular, said first light intensity detector 325-1 detects and then converts into electrical signals an intensity distribution reflected into the light path directly from the colloid sphere monolayer 312 and being practically identical to the one that exists on the surface of the spheres. At the same time, the light intensity detectors 325-2 and 325-3 detect and then convert into electrical signals the intensity distributions of light beams 302 that are first reflected by the colloid sphere monolayer 312 into the light path and then by said transparent element 323 arranged in the light path indirectly into the regions located along the stage 322. In the arrangement shown here, the matching between the series of spheres in said colloid sphere monolayer 312 and the illuminating interference pattern can be considered perfect (and results, hence, in maximal near-field intensity enhancement which is the basis of the combined interference/colloid sphere lithographic method according to the invention) if (i) the combined resultant intensity of beams reflected by the colloid sphere monolayer 312 and then detected by said first light intensity detector 325-1 capable of resolving said interference pattern is maximal and the visibility of said interference pattern defined by the relation $(I_{max}-I_{min})/(I_{max}+I_{min})$ is maximal as well (here $I_{max}$ and $I_{min}$ refer the maximum and minimum, respectively, of the intensity of the interference fringes of said interference pattern; in case of proper ratios of the chip size used in the CCD cameras and the periodicity of the interference fringes, the interference pattern becomes visible as well), and furthermore (ii) the lateral light intensity detectors 325-2, 325-3 indicate maximal and symmetric light intensity distribution. The position of the stage 322 (and thus also of the sample) is fine tuned by means of said translators 324 until the above criteria (i) and (ii) are fulfilled simultaneously. The control unit 320 monitors the electrical signals sent by said light intensity detectors 325-1, 325-2, 325-3 and based on the changes of the signals, it sends control signals of proper effects to the translators 324 that, as a response to said control signals, will vary the position of the stage 322 in precision steps relative to the illuminating interference pattern until perfect matching is achieved. It is noted that in case of imperfect matching, the contrast ratio of the pattern will not be perfect either; if the interference pattern and the series of colloid spheres are not "aligned", undesirable structuring may take place, wherein said interference pattern may strike the spheres in various patterns with a periodicity greater than what would be desired.

Figure 5C:
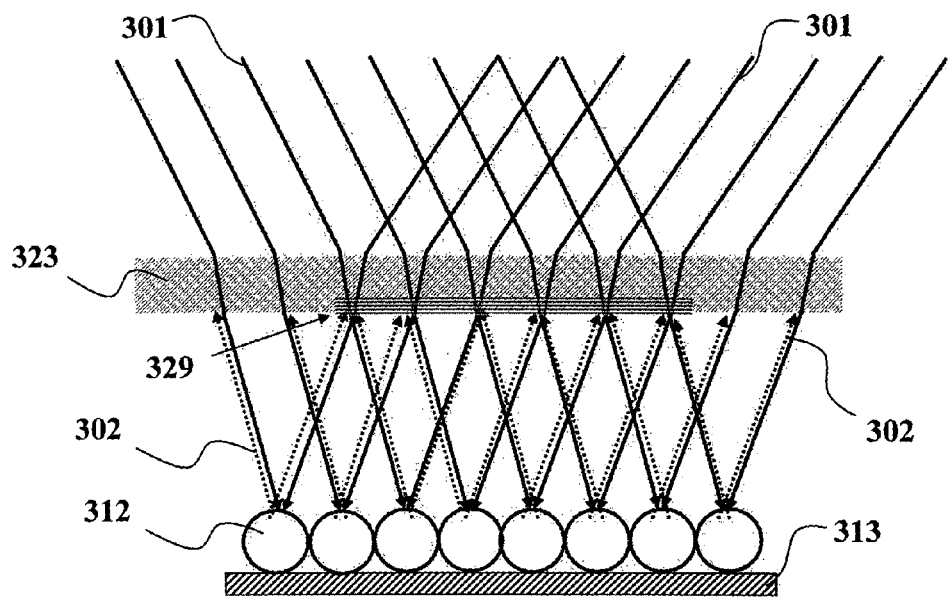
FIG. 5C illustrates schematically a further arrangement for matching a colloid sphere monolayer and an interference pattern obtained by two-beam interference in e.g. the type (I) or type (II) orientation (see FIG. 1)

Contrary to FIG. 5B illustrating a manner of matching accomplished in-situ, FIG. 5C schematically shows a possible further kind of matching, wherein the determination as to whether matching has already been achieved or not takes place not in-situ. As it is shown in FIG. 5C, here a layer 329 of a light-sensitive substance (preferably a photoresist) is applied onto the side of the transparent element 323 facing to the sample, said transparent element 323 being arranged in an arbitrary plane locating behind the plane in which the incident beams overlap one another. In this embodiment, a basis for sensing as to whether matching has been achieved is the following: the resultant total light intensity provided by the two illuminating beams 301 and the beams 302 reflected by the colloid sphere monolayer 312 exceeds a threshold value required to induce photochemical transition in the applied light-sensitive substance in the plane of layer 329 only if the interference pattern generated by the passing incident beam and the reflected beam exhibits maximal visibility, and only at the points of maximum intensity in said pattern. Consequently, the interference pattern (or rather its specific effect) will only manifest itself in the layer 329 of the light sensitive substance if the series of spheres in the colloid sphere monolayer 312 and the interference pattern providing the illumination are in perfect matching position.

It should be here noted that in case of illumination generated by multi-beam interference, matching the series of colloid spheres with the spatially modulated intensity distribution can be achieved via arrangements that are similar to those shown in FIGS. 5B and 5C. However, in such a case the number of light intensity detectors to be arranged around the stage carrying the sample to be structured should correspond to the order of symmetry; the number of light intensity detectors to be used and their positions around the stage are determined by symmetry properties of the illumination generated via said multi-beam interference. More specifically, the required minimum number of light intensity detectors is generally equal to the order of symmetry of the interference pattern obtained. It is preferred to arrange the individual light intensity detectors along the symmetry axes of said interference pattern in such a way that one detector is located on either side of each of the symmetry axes.

FIGS. 6 to 9 show simulation results regarding intensity modulations that vary periodically over the scale of an order of 100 nm, said scale is a result of illuminating colloid sphere monolayers of different types (metal, dielectric) with linearly polarized light having spatially modulated intensity distribution obtained via two-beam interference. The simulation was performed by the RF module of the COMSOL software package available commercially [distributor: Gamax Kft., Hungary] with the application of a specific 3D model that allowed illumination of a colloid sphere monolayer assumed to be infinite in size with several incident beams of arbitrary wavelength and polarization and at any angle of incidence $\theta^{(i)}$. By means of the simulation, the time-averaged electric field is investigated in planes located behind the spheres, that is, on the surface of a substrate to be structured. With a knowledge of this, the increase in intensity due to the colloid spheres can be determined, and on the basis of the lateral intensity distribution predictions can be made as to the size and expected fine structure of the nano-objects which can be fabricated. A perfect synchronization of the interference pattern with the colloid sphere monolayer was maintained in the numerical calculations.

FIGS. 6 to 9 illustrate simulation results for the effect of gold (FIGS. 6, 7, 9) and quartz (FIG. 8) colloid sphere monolayers arranged on substrate films made of gold (plots A, B, D, E) and polycarbonate (plots C, F) on the intensity distribution of the illumination provided by linearly polarized light on the substrate surface to be structured in the direction of propagation of said illuminating beam. FIG. 10 illustrates simulation results for the effect of gold colloid sphere monolayers arranged on substrate films made of gold (plots A, B, D, E) and polycarbonate (plots C, F) on the intensity distribution of the illumination provided by circularly polarized light. Plots A and D of FIGS. 6 to 10 always provide reference—said plots illustrate the effect of perpendicular illumination with the total intensity of two illuminating beams for the same wavelength, polarization and colloid spheres, assuming a substrate made of gold. For plots B, C, E and F related to oblique incidence, the plane studied is always perpendicular to the direction of the bisectrix of the illuminating light beams, i.e. to the incidence norm.

It can be seen in the figures related to perpendicular incidence (FIGS. 6 to 10; plots A and D) that near-field intensity distribution is maximal in the regions below the colloid spheres made of gold or quartz. This means that the colloid spheres at issue behave as microlenses in the microstructuring performed by the combined interference/colloid sphere lithographic method.

Figure 6:
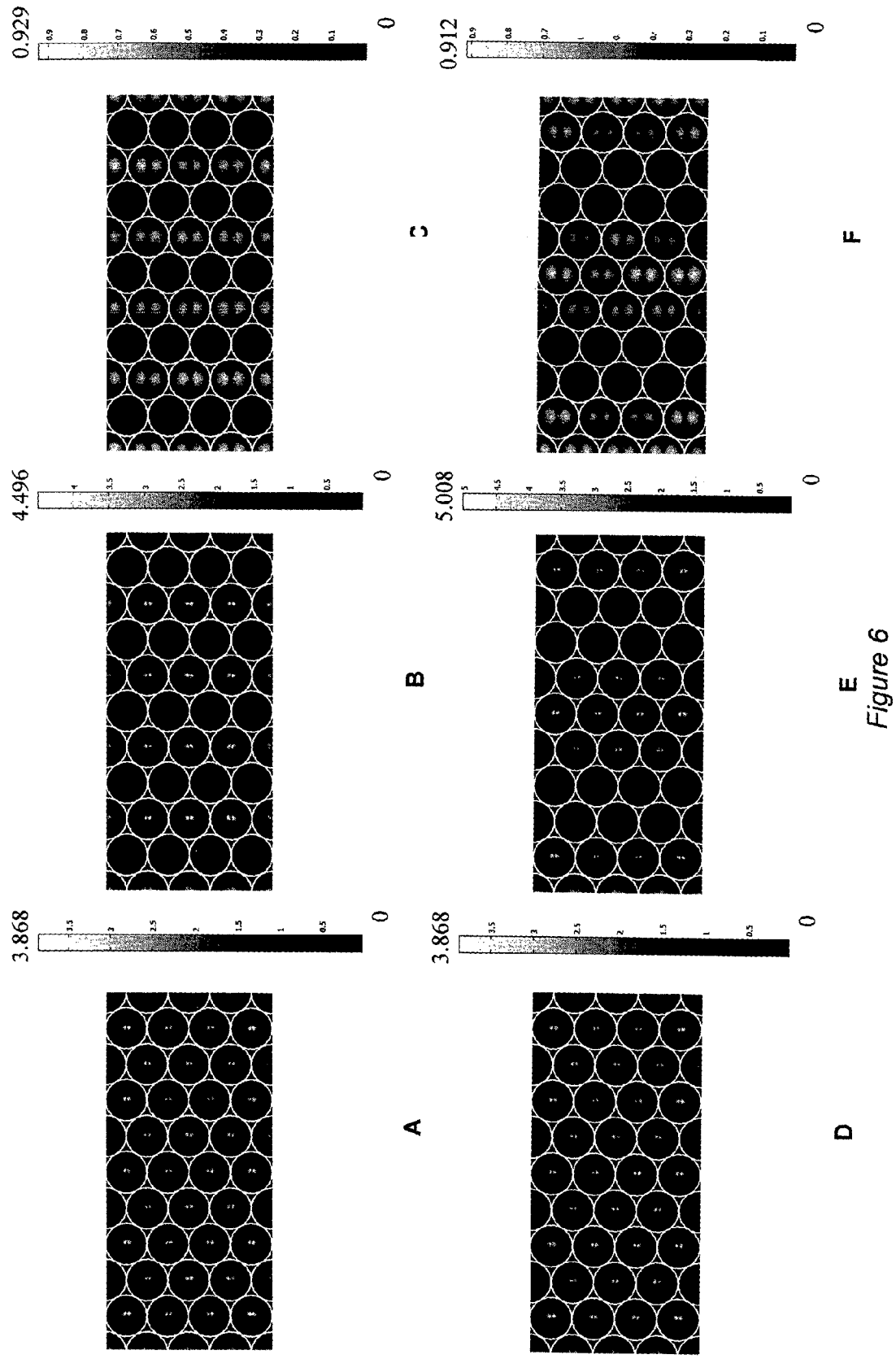
Figure 7:
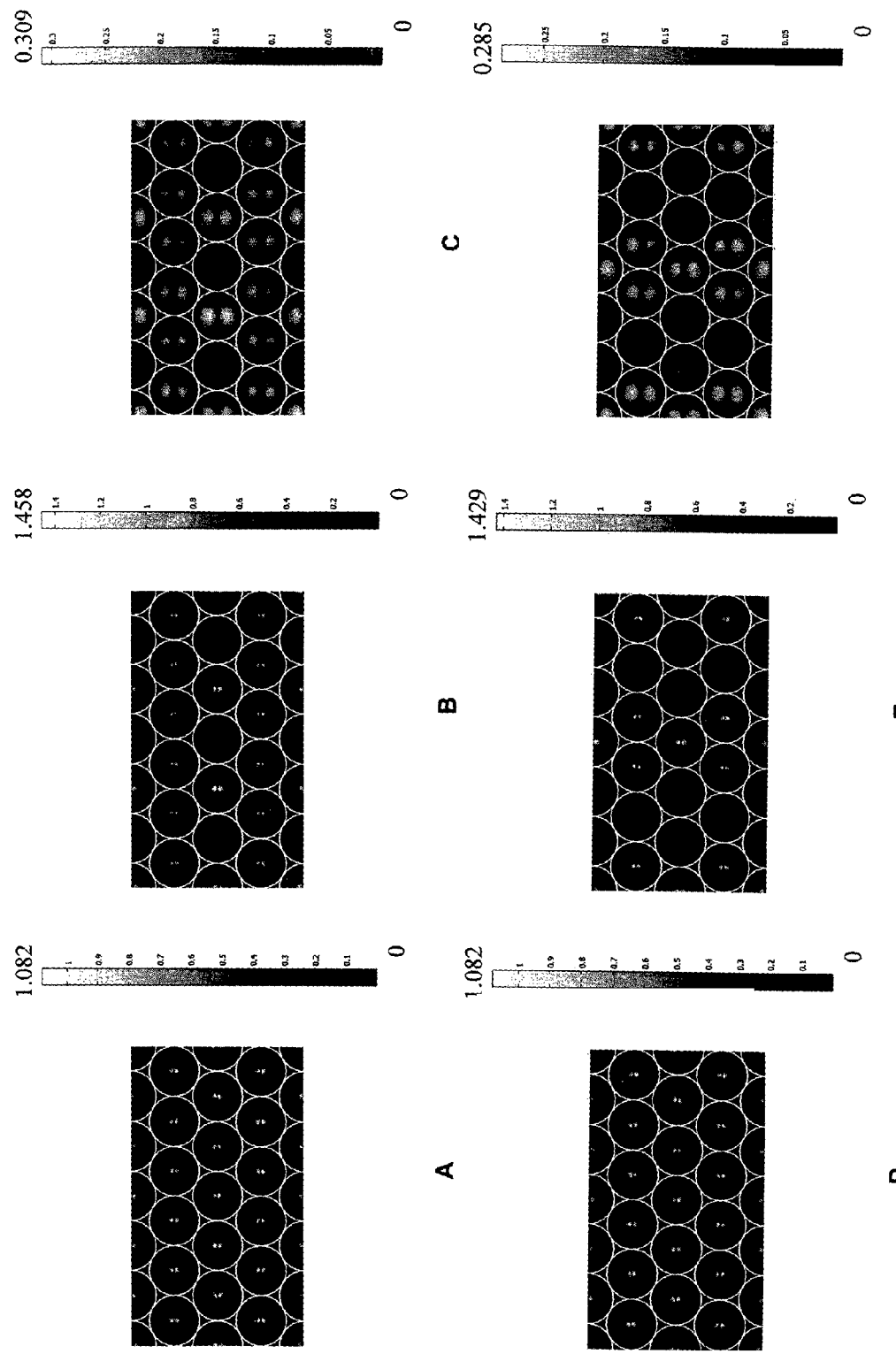
Figure 8:
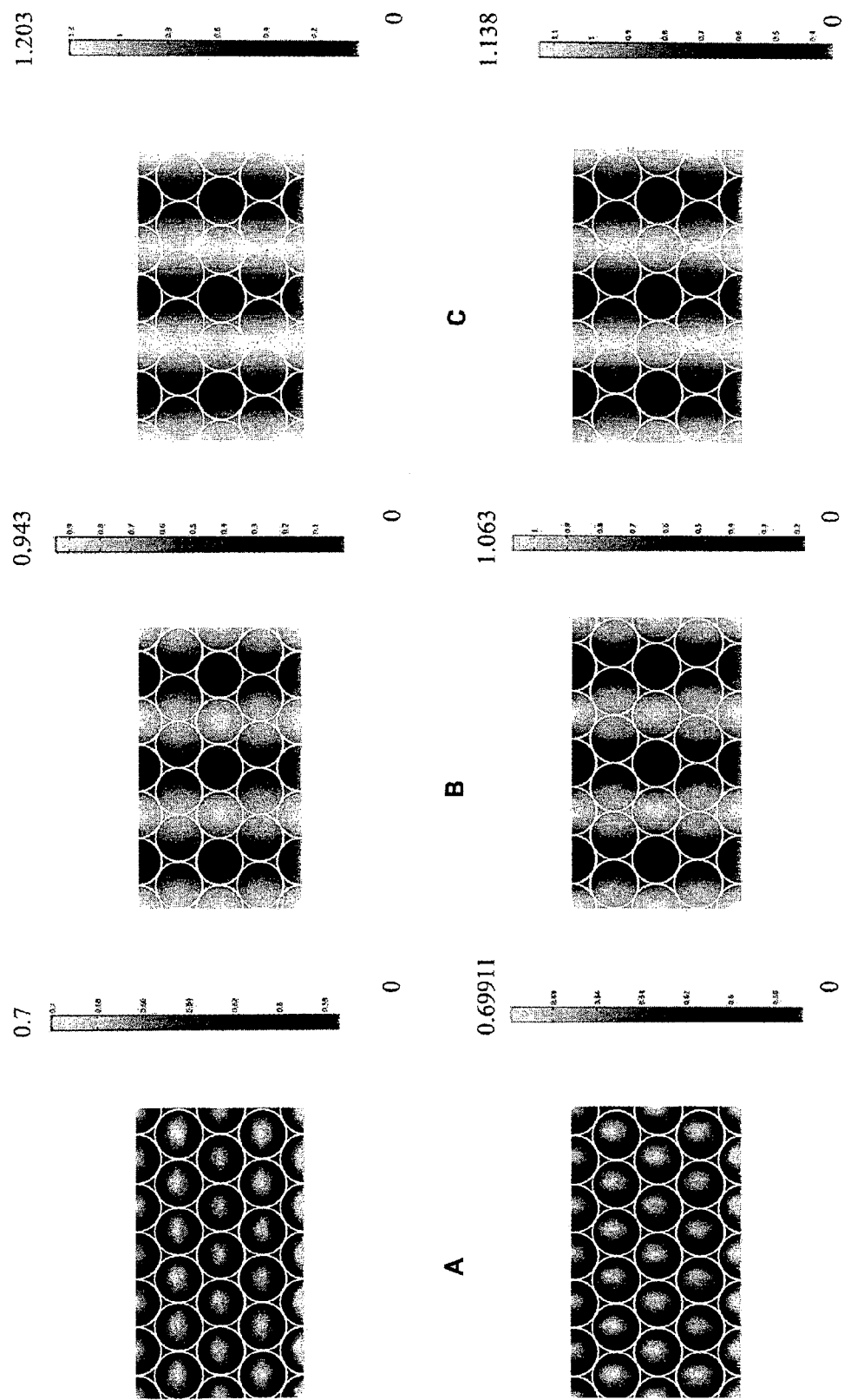

It is noted that the symmetry and characteristic periodicities of an intensity distribution emerging in the substrate surface do not change if a dielectric substrate is used instead of a metallic one. The increase in intensity behind the colloid spheres is higher if metallic substrates are illuminated through metallic spheres. In case of illuminating metal spheres of 250 nm in diameter with linearly polarized light as shown in FIGS. 6 to 7, the full width at half maximum of the intensity distribution forming behind the colloid spheres, i.e. the size of nano-objects that can be fabricated by the method is larger for dielectric substrates. In case of illuminating quartz spheres of 250 nm in diameter as shown in FIG. 8, the full width at half maximum of the intensity distribution forming behind the colloid spheres, i.e. the size of nano-objects that can be fabricated by the method is significantly larger for dielectric substrates, it does not allow the fabrication of separate objects. Smaller metallic colloid spheres of about e.g. 100 nm in diameter (FIG. 9) result in an intensity distribution that is characterized by significantly smaller full width at half maximum for metallic substrates—similarly to FIGS. 6 and 7—and, hence, allow the fabrication of smaller nano-objects upon illumination with light of 532 nm in wavelength. The attainable nano-object size is also smaller in metallic substrates upon illumination with light of 400 nm in wavelength (compare plots E and F of FIG. 9). Metallic colloid spheres that exhibit a size which is almost resonant at the wavelength of 532 nm used for the illumination result in a significantly higher increase in intensity along with a significantly smaller full width at half maximum, as can be proven by comparing plots B, C and E, F of FIG. 9 in pairs. In case of illuminating gold colloid spheres of 250 nm in diameter with circularly polarized light as shown in FIG. 10, the increase in intensity will be higher and the FWHM will be smaller on metallic substrates, similarly to FIGS. 6 and 7. The combined interference/colloid sphere lithographic method according to the invention is, however, equally applicable for the surface structuring of both metallic and dielectric substrates.

Figure 9:
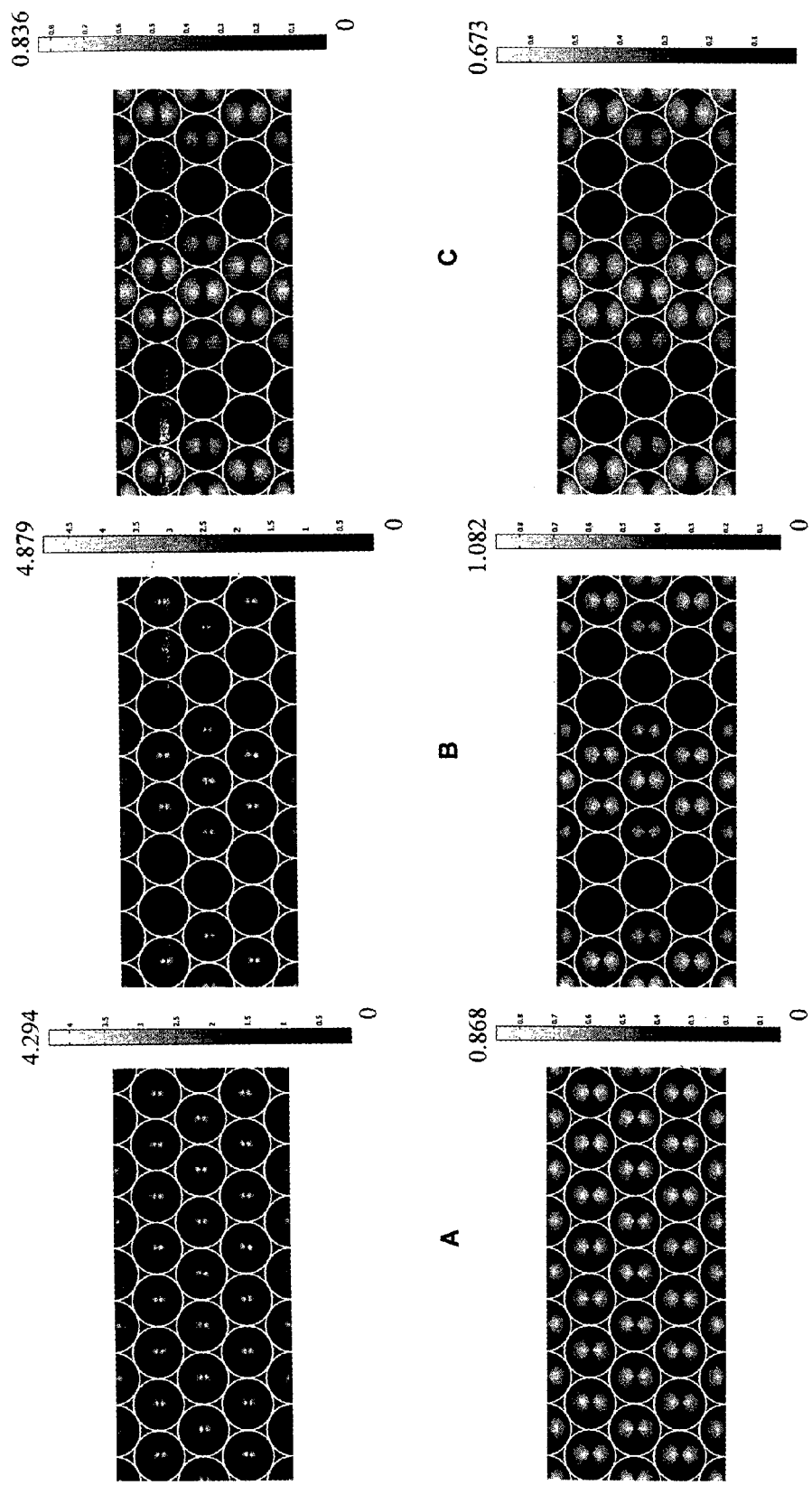

When the illumination is performed with linearly polarized light, the intensity distribution will be dipolar in nature behind the colloid spheres, as a result of which behind gold spheres a fine structure comprised of doublet nano-objects along the direction of polarization (E vector) forms, as shown in FIGS. 6, 7 and 9, while behind quartz spheres an elliptical shape intensity distribution that is elongated in the direction perpendicular to the direction of polarization (E vector) forms, as shown in FIG. 8. Behind the quartz spheres (see plots D to F of FIG. 8), an illumination with S-polarized and P-polarized light results in an elongation that extends perpendicular to and along, respectively, the interference fringes.

When metallic colloid spheres are illuminated with circularly polarized light, the intensity maxima appear along a ring (having a width characterized by the parameter $d_O$), the dimension of which depends on the wavelength $\lambda$, the colloid sphere diameter d, as well as the type of material of said colloid spheres and substrate, for perpendicular incidence, under each sphere uniformly, and in case of illumination with two interfering beams, directly along the maxima of the interference pattern (see FIG. 10).

At the same time, for incoming beams with non-zero angle of incidence, due to the finite lateral dimension of the interference pattern, a secondary structure arises along lines falling directly under the intensity maxima. The smaller the angle of incidence is, due to the broader interference maxima, the greater the illuminated area is. Said greater broadening allows a controlled development of islands heated up under the partially illuminated adjacent series of spheres in turn. Furthermore, adjusting the energy density ensures the separation of said islands. The lateral splitting of the secondary interference pattern can be tuned with both the angle of incidence $\theta^{(i)}$ defining the periodicity and the diameter d of the colloid spheres. Moreover, the extent of said secondary structure forming due to lateral splitting can be controlled by selecting a suitable machining (preferably ablation) threshold (see plots B, C, E, F of FIGS. 7 to 10).

For different relative orientations of the interference pattern and the colloid sphere monolayer, the secondary structure shows significantly different in-plane distributions. If the colloid spheres are illuminated in e.g. the type (I) or type (II) geometries, due to the different arrangement/distance of the colloid spheres with diameter d that locate directly under the interference maxima (for type (I) geometry $t^{(I)}=d$, while for type (II) geometry $t^{(II)}=\sqrt{3}\cdot d$), different patterns will form. Specifically, patterns with symmetries depending on the geometry of the illumination may form, for example if the illumination is provided by two-beam interference, typically a periodic array of linearly arranged "nano-butterflies" (see plots B, C, E and F of FIG. 6) or of hexagonally arranged "nano-flowers" (see plots B, C, E and F of FIGS. 7 to 10). If the structuring takes place by means of colloid spheres of larger size, the obtained nano-objects will also be larger and at the same time will be located farther from one another (as is apparent from the comparison of FIGS. 6, 7 with FIG. 9).

In plots B, C and E, F of FIG. 6, the tuning of parameter p is illustrated in the type (I) geometry, along with illuminating gold colloid spheres of 250 nm in diameter with S-polarized light of 532 nm in wavelength ($\delta_S^{(I)}=0°$). Along with the tuning of angle $2\theta$ formed by the two incident beams, the cases m=2 and m=5 are discussed in detail. As it can be seen from plots E and F of FIG. 6, for greater periodicity p, due to broader interference maxima, significant enhancement of the electromagnetic field appears not only under the series of spheres illuminated centrally, but to a small extent also under the two adjacent series of spheres located in parallel with the centrally illuminated one. A secondary structure can be observed along the lines of nano-objects, while the intensity shows a vertically dipolar distribution under the individual colloid spheres. Thus, in this example, the fine structure forming due to synergic effect is comprised of the "nano-butterflies" arranged vertically below one another.

In plots B, C and E, F of FIG. 7 taken for the same wavelength as above, with S-polarized light, in type (II) geometry, and with setting the angles to correspond to cases m=2 and m=3, one can observe that the periodicity p is tunable with the angle of incidence $\theta$, however, in this geometry a pattern is received that highly differs from the one obtained for type (I) geometry as $\delta_S^{(II)}=30°$ holds. The extension of the interference maxima is faint and, in turn, results in the appearance of a prominent secondary background pattern with dipolar maxima of vertical orientation along the interference pattern. Here, the increase in the intensity of the secondary pattern can take place again by increasing the periodicity p (by decreasing the angle of incidence $\theta$), but it arises already at smaller angles of incidence $\theta$. Here, the fine structure forming due to synergic effect is comprised of the "nano-flowers" that are arranged vertically below one another.

In plots B, C of FIG. 7, a marked duplication ($d_0$) can be seen under the colloid spheres located at a distance $t^{(II)}=\sqrt{3}\cdot d$ from one another when being illuminated with the interference maxima at an angle of incidence corresponding to m=2. Moreover, under two spheres located vertically along the maxima at a distance $t=\sqrt{3}\cdot d/2$ from the former spheres, a smaller increase in intensity shows up again. Plots E, F of FIG. 7 illustrate a case with the angle of incidence corresponding to m=3, wherein a marked duplication ($d_0$) can be observed upon illuminating with the interference maxima under colloid spheres located at a distance $t^{(II)}=\sqrt{3}\cdot d$ from one another, however, a significant increase in intensity emerges not only under the edges of the two spheres located vertically at a distance $t=\sqrt{3}\cdot d/2$ between said spheres, but also under the spheres located laterally at a distance d beside said spheres. Consequently, a structuring can be accomplished in this case as well.

Plots B, C ($\delta_S^{(II)}=30°$) and plots E, F ($\delta_P^{(II)}=60°$) of FIG. 8 illustrate the influences of S-polarization (plots B, C) and P-polarization (plots E, F) in type (II) geometry, in case of quartz colloid spheres of 250 nm in diameter and at an angle of incidence corresponding to m=2 (that is, for an illumination analogous to the one used in the case of plots B, C of FIG. 7). Comparing plots B, C of FIG. 8 with plots B, C of FIG. 7 obtained with the illumination provided by S-polarized beams, it is apparent to a skilled person in the art that in case of quartz spheres both the secondary structure and the fine structure are much less contrasty, and furthermore the latter is less centered. In plot B of FIG. 8 a marked elongation perpendicular to the polarization direction can be observed under the colloid spheres illuminated with the interference maximum. The analogous elongation under the two spheres located between said colloid spheres vertically at a distance $t=\sqrt{3}\cdot d/2$ forms in the vicinity of the edges of the colloid spheres, with smaller increase in intensity. From plot C of FIG. 8 it can be seen, however, that when a monolayer of quartz colloid spheres is arranged over a substrate made of dielectric material, an elongation with a small contrast can after all be observed under the individual spheres, but the overall result hardly differs from a periodic system of fringes generated by two-beam interference. This clearly proves that from the point of view of accomplishing the combined interference/colloid sphere lithographic method according to the invention, making use of metallic, in particular Au colloid spheres, is much more preferred.

Comparing now plots B, C and plots E, F of FIG. 8 with one another, it can be seen that for P-polarized illuminating beams the intensity distribution in the plane behind the colloid spheres, and thus the nature of a microstructure fabricated on a substrate surface that coincides with this plane via ablation changes fundamentally. Furthermore, the elongation of locations of maxima arises along the interference fringes, i.e. the fine structure will be parallel with the interference pattern.

Plots A to F of FIG. 9 illustrate the effects of a smaller, that is 100 nm in magnitude, colloid sphere diameter. In plots B, C of FIG. 9, simulation results obtained for type (II) geometry (similarly to the case of plots E, F of FIG. 7) with illumination provided by S-polarized light at the wavelength of 532 nm can be seen. A comparison of the plots related to the diameter of 100 nm (see plots A to C of FIG. 9) with the plots that belong to the diameter of 250 nm (see plots D to F of FIG. 7) proves that the geometrical parameters p, a and $d_0$ can also be tuned with the size of the colloid spheres made use of. For smaller diameter d of the colloid spheres, all characteristic lengths will be smaller, but the secondary structure will arise below relatively more adjacent spheres.

Plots B, C and E, F of FIG. 9 show intensity distributions obtained by applying illuminating light of 532 nm and 400 nm, respectively, at an angle formed by said light beams corresponding to m=4. From the plots at issue, one can observe that the increase in intensity—especially in case of a metallic substrate—is much larger at gold's resonance wavelength of 532 nm. The distance between the two intensity peaks within the nano-objects forming in the less intense near-field due to illuminating with non-resonant light of 400 nm will, however, be greater, that might be advantageous in practice for such applications that are based on a coupling between nano- and plasmonic systems. The difference can be observed in case of policarbonate substrates as well, however, its magnitude is not so significant. Without going into deeper theoretical speculations, it is thought that this comes from the fact that the intensity distribution behind metallic colloid spheres is influenced substantially by the fact whether or not the colloid sphere monolayer is illuminated at a wavelength being a characteristic resonant wavelength of the metal concerned. If the individual colloid spheres in the applied monolayer are made of gold, by performing the illumination with light of 532 nm in wavelength, more effective structuring can be achieved even in case of non-resonant sphere sizes than in a case wherein illumination is carried out with light of 400 nm in wavelength being away from resonance. When gold colloid spheres of 100 nm in diameter are illuminated with light of 400 nm in wavelength, the intensity of the electromagnetic field generated by said spheres will be much smaller, as no resonance develops.

FIG. 10 illustrate the effects of circularly polarized light. The fine structure consists of circular symmetric "nano-rings" developing under the interference maxima, while the secondary pattern—which is a consequence of the finite dimension of the interference maxima—is comprised of "nano-crescents" and circular arcs with uneven intensity distribution. Plots B, C of FIG. 10 show simulation results obtained for gold colloid spheres of 250 nm in diameter, in type (I) geometry corresponding to the case of plots E, F of FIG. 6, at an angle of incidence corresponding to m=5. At the same time, plots E, F of FIG. 10 illustrate simulation results obtained for a monolayer of gold colloid spheres of 250 nm in diameter corresponding to the case of plots E, F of FIG. 7, that is in type (II) geometry, for two circularly polarized illuminating beams incident at an angle that corresponds to m=3.

In what follows, the method to create microstructures according to the present invention is illustrated through several 2D examples.

By means of the combined interference/colloid sphere lithographic method according to the invention ordered patterns of nano-objects can be fabricated in the surface of various materials (fabrication of 2D microstructures). Due to direct illumination, for example series of holes form in metallic films, and via multistep processes, e.g. by means of metal vapour deposition of holes inscribed into various masks, patterns of nano-particles can be prepared.

In structuring by laser, the application of UV light is preferred, as larger lateral resolution, that is smaller geometrical lengths can be obtained at smaller wavelengths. The application of short pulses ensures a further characteristic decrease in size, as in case of fs laser pulses the size of thermally affected regions de-creases. The effect of colloid spheres made of suitable material and with proper geometry significantly reduces the ablation threshold. To obtain optimal results, the plane of maximal intensity located behind the spheres must coincide with the surface of the sample to be structured. This can be achieved by means of appropriate ratios for the indices of refraction and spacers (made of e.g. dielectric materials).

Example 1

A monolayer is prepared from bulkloaded quartz colloid spheres by the Langmuir-Blodgett technique on Au—Ag bimetallic layers that were vacuum deposited onto the surface of a substrate made of optical glass (crown-glass) under the code NBK7 according to the Schott catalogue. Via illuminating said layer with an UV laser ($\lambda=266$ nm, 10 ns), a multiplicity of series of holes can be prepared in this layer if the incoming laser beam provides an energy density of $F_i=100$ mJ/cm$^2$; according to our calculations, the quartz colloid spheres of D=500 nm in diameter increase said incoming energy density to a value that is 6.2 times higher considering the peak intensity. The same sphere diameter results in about a twofold intensity enhancement at the wavelength of $\lambda=800$ nm, which facilitates reaching the threshold of $F_i=400$ mJ/cm$^2$ required to structure Au via illumination with pulses of 100 fs in duration. In case of smaller sphere diameter D=250 nm, due to the five-fold intensity enhancement the ablation threshold of $F_i=1000$ mJ/cm$^2$ determined for the illumination with a pulse of 10 ns in duration for Au can be reached as well.

Example 2

An Au—Ag bimetallic layer vacuum deposited onto the surface of a substrate formed of optical glass under the code NBK7 is coated with an aluminium oxide/anodised aluminium ($Al_2O_3$) film. On the thus obtained multilayer, a quartz colloid sphere monolayer is prepared by the Langmuir-Blodgett technique. To form a mask, series of holes are fabricated in the $Al_2O_3$ layer via illumination with UV laser ($\lambda=266$ nm, 10 ns) at an energy density of $F_i=100$ mJ/cm$^2$, which is increased by the quartz colloid spheres of D=500 nm in diameter to a value that is 6.2 times higher—according to the calculations performed. After metal vapour deposition of the thus obtained multiplicity of series of holes, the layer containing $Al_2O_3$ is removed by an NaOH solution. The form of the remaining nano-particle pattern is modified according to needs via further laser irradiation, melting.

The geometrical parameters characterizing complex microstructures that can be fabricated by the combined interference/colloid sphere lithographic method according to the present invention can be tuned independently from one another, thus such novel kind of microstructures can be formed by the method, in case of which a multi-level spectrum modification can be realized. When metallic thin films are used, plasmonic phenomena take significant role in forming the spectrum of a bulk material 200. If, for example, a wavelength that corresponds to the plasmon resonance frequency of the thus obtained nano-object accords with the periodicity of a pattern built up of such objects, depending on the fact whether the nano-objects are actually nano-particles or nano-holes, absorption maxima/minima (and corresponding transmission extrema) will become observable in the spectrum at the wavelength concerned. Without going into deeper theoretical considerations, this feature is based on a coupling between localized plasmons excited around the nano-objects at the metal/dielectric interface and the propagating photonic/plasmonic modes scattered by the periodic pattern, acting as lattice, formed by said plasmons.

FIG. 11 shows the influences of the geometrical parameters discussed above in detail on the absorption and transmission spectra (the transmission be measured in practice) of Au metallic films of 45 nm in thickness structured by the combined interference/colloid sphere lithographic method according to the invention. Structuring of said metallic films takes place in 2D geometries illustrated in plots (a) to (c) in the bottom part of FIG. 11. Here, nano-holes were fabricated on the metallic films as nano-objects in a manner detailed previously in relation to FIG. 2.

The left-side column of charts labelled "absorption" in FIG. 11 clearly shows that the extrema of the absorption spectrum of a metal film provided with a pattern of nano-holes of proper symmetry and geometrical parameters fabricated by the combined interference/colloid sphere lithographic method according to the invention can be nicely tuned. Therefore, the metal films prepared by the inventive method can be used, for example, to form the sensing elements of selective (bio)sensors, as the spectral properties of said metal films can be tailored preferably to an absorption/transmittion maximum of an object to be detected (e.g. a specific bio-molecule).

From the right-side column of charts in FIG. 11, which illustrate the transmission normalized over the surface of the holes, it can be seen that the metal films provided with a pattern of holes give rise to a so-called extraordinary transmission (EOT), and hence an element prepared by utilizing the thus obtained metal films can be used as an optically active element as well. This latter property of said structured metal films is due to the fact that localized plasmons can be excited within each of the nano-holes and said plasmons get coupled with plasmons propagating away on the continuous metal film, as it was predicted by T. W. Ebbesen at al. (for further details the reader is referred to Nature 391, pp. 667-669 (1998)). It is noted that the spectra shown here are so-called near-field spectra that have been determined by numerical techniques in near-field of nano-object patterns. Independently of pattern, a peak characteristic of thin films is present in the transmission at the wavelength of gold (i.e. at 509 nm) at which the absolute values of the real and imaginary parts of the dielectric constant are equal.

In the elementary charts of FIG. 11, a comparison of the results for illumination in air (dashed line) and illumination in a medium having an index of refraction equal to that of the substrate (solid line) are provided. It can also be seen from the figure at issue that the absorption extrema and the position of EOT corresponding to maximum in transmission may finely be tuned further with the index of refraction of the medium filling up the holes and located above the metal film. An extent of transmission at a given wavelength can be controlled by the index of refraction of the medium which enables the films with holes to operate as optical switching elements.

The absorption extrema and EOT manifesting itself in transmission maxima due to coupling between the propagating and the localized plasmons can be tuned with the characteristic length of the given pattern of holes, that can be controlled practically in an arbitrary way by means of the combined interference/colloid sphere lithographic method according to the invention.

SUMMARY

An important advantage of the novel technique according to the present invention resides in its applicability to prepare microstructures with e.g. preset absorption and corresponding transmission spectra on a relatively large (~dm$^2$) surface area. In particular, the periodic structure that is in conformity with a geometry specified in advance is repeated at least in one spatial direction at least several thousand times.

Moreover, the technique according to the present invention provides controllability over all the important geometrical parameters of structures with periodic construction (in 2D: a size a of the nano-objects determined by the colloid sphere diameter and material, the wavelength and the power density, a distance $t^{(i)}$ (i=I, II, . . . ) determined by the relative orientation of the colloid sphere monolayer and the interference pattern, as well as a periodicity $p_m^{(i)}$ (i=I, II, . . . ) determined by the wavelength and the angle of incidence; in 3D: the size a, the distance $t^{(i)}$ (i=I, II, . . . ), the periodicity $p_m^{(i)}$ (i=I, II, . . . ) and the $D_n^{(i)}$ Talbot length which is determined by the wavelength and the periodicity $p_m^{(i)}$), and thus allows to engineer/modify the absorption/emission and corresponding transmission spectrum practically in a predefined manner. The objects of the microstructures fabricated in conformity with a pattern due to a combination of the hexagonal structured colloid sphere monolayer and a spatial intensity modulation of given symmetry and with characteristic periodicity, being matched/synchronized with said colloid sphere monolayer, might optionally exhibit a further, polarization dependent, inherent fine structure as well, that scales with a parameter $d_0$, which represent a yet further degree of freedom when a predefined modification of the spectrum is to be performed. As a result of the above, extremely narrow spectral peak(s) (i.e. characterized with a small FWHM) emerges/emerge in the spectra of the microstructures fabricated by the novel method according to the invention. Thus, said structures will absorb/transmit with extremely high efficiency at the energy/energies corresponding to said peak/peaks, i.e. they are capable of highly selectively absorbing/transmitting the excitations at this/these energy/energies.

As a consequence of this latter property, the microstructures having unique spectral properties fabricated by the method according to the invention can be used in numerous fields of practice. Without completeness, they can be utilized as the sensing component of e.g. novel type selective and high-sensitivity bio-sensors: knowing the spectrum of the (bio)molecule to be detected, such sensing surfaces can be designed and prepared that are applicable to detect even a single molecule.

A yet further application field for the novel type microstructures fabricated by the method according to the invention is the field of 2D opto-electronics: due to the multiple coupling between nano-objects that are located close to one another, a plasmon based signal transmission becomes available with arbitrary geometries and to very large distances.

As it is apparent to a skilled person in the art, numerous modifications can be effected on the novel type microstructuring method and setup according to the invention without exceeding beyond the scope of protection claimed here by the attached set of claims.

The invention claimed is:

1. Method to provide a substrate with microstructure, wherein a substrate with a region of a certain size to be structured is provided, comprising the steps of:
    forming a colloid sphere monolayer by applying colloid spheres into said region, said colloid sphere monolayer exhibiting a given geometrical symmetry; and
    illuminating said colloid sphere monolayer with a beam of spatially modulated light intensity distribution comprising an interference pattern with a periodicity over the region of the certain size, thereby performing light-induced structuring in said region in accordance with a desired pattern by concentrating beam intensity via near-field effect behind said colloid sphere monolayer in the propagation direction of light.

2. The method according to claim 1, further comprising the step of orienting said interference pattern relative to the colloid sphere monolayer and thereby achieving contrast enhancement via the colloid sphere monolayer.

3. The method according to claim 1, further comprising the step of matching the direction of interference fringes in said interference pattern with a geometrical symmetry direction of said colloid sphere monolayer.

4. The method according to claim 3, wherein said matching of the direction of the interference fringes in said interference pattern with the colloid sphere monolayer is performed by monitoring diffraction orders of the interference pattern reflected from said colloid sphere monolayer illuminated by the interference pattern, including, determining directions of expectable diffraction orders, performing rotational synchronization of said interference pattern and said colloid sphere monolayer based on intensity measurements for said reflected interference pattern of at least a certain diffraction order, detecting intensity of said diffraction order, and based on the intensity, adjusting laterally said monolayer until a maximal intensity has been achieved.

5. The method according to claim 1, further comprising, previously to the step of forming said colloid sphere monolayer, the step of forming one or more metallic thin films in said region of the substrate to be structured, thereby increasing further intensity enhancing effect of said near-field.

6. The method according to claim 1, wherein said light-induced structuring is performed by ablation and/or photo-chemical etching.

7. The method according to claim 6, wherein a microstructure with periodicity falling into different size ranges along at least two spatial directions orthogonal to one another is formed in said region of the substrate by said light induced structuring.

8. The method according to claim 7, wherein said region of the substrate is chosen from a group comprising an in-plane (2D) region and a volume (3D) region.

9. The method according to claim 7, wherein polarized light is used.

10. The method according to claim 1, wherein said beam of spatially modulated light intensity distribution comprising the interference pattern with the periodicity over the region of the certain size is generated by one of two-beam interference, multi-beam interference, and coherent diffraction.

11. The method according to claim 1, wherein material of said colloid spheres comprises a metal or a dielectric material or a combination of colloid spheres made of either metal or dielectric materials.

12. Method to fabricate a periodic pattern of surface and/or volume objects on/in a target region of certain size of a substrate, comprising performing an interference lithographic structuring technique and a colloid sphere lithographic technique combined with one another, wherein said interference lithographic structuring technique comprising applying a beam of spatially modulated light intensity distribution comprising an interference pattern with a periodicity over the target region of the certain size onto a monolayer of colloid spheres pre-arranged on/in said target region of the substrate.

13. The method according to claim 12, wherein performing said interference lithographic structuring technique comprises the step of orienting said interference pattern relative to the monolayer of colloid spheres so as to achieve contrast enhancement via the monolayer of colloid spheres.

14. The method according to claim 13, wherein said orienting comprises matching of the direction of interference fringes in said interference pattern with a geometrical symmetry direction of the monolayer of colloid spheres.

15. The method according to claim 14, wherein a periodic pattern of surface and/or volume objects having at least two periods defined by spatial repetition of the objects in said periodic pattern along various directions, with periods falling into different size ranges along at least two spatial directions that are orthogonal to one another.

16. The method according to claim 15, wherein at least one of said periods is commensurate in at least one direction with the wavelength ($\lambda$) of light representing a characteristic length parameter for said interference lithographic structuring technique.

17. The method according to claim 15, wherein at least one of said periods is commensurate in at least one direction with the colloid sphere diameter representing a characteristic length parameter for said colloid sphere lithographic structuring technique.

18. The method according to claim 15, wherein at least one of said periods is several tens of nm to 100 nm in a first one of the spatial directions, and is on into the order of 100 nm to 1 µm in a direction orthogonal to said first direction.

19. The method according to claim 12, wherein the surface and/or volume objects having a size representing a characteristic length parameter for the objects is chosen to be below the diffraction limit to a range on the order of 1 to 100 nm.

20. The method according to claim 12, wherein said periodic pattern of objects exhibits a further length parameter ($d_0$) besides said characteristic length parameters that is characteristic to an inherent fine structure of the fabricated objects.

21. The method according to claim 20, wherein said inherent fine structure ($d_0$) is tuned with the type of polarization of said beam used in the interference pattern used in said interference lithographic structuring technique, and in case of linear polarization, said inherent fine structure ($d_0$) is tuned with the polarization direction.

22. Method to provide a substrate with microstructure, wherein a substrate with a region of certain size to be structured is provided, comprising the steps of:
    forming a colloid sphere monolayer by applying colloid spheres into said region, said colloid sphere monolayer with characteristic periods exhibiting a given geometrical symmetry; and
    illuminating said colloid sphere monolayer with a beam of spatially modulated light intensity distribution comprising an interference pattern with a periodicity over the region of the certain size, said periodicity being matched to the characteristic periods of the colloid sphere monolayer with given geometrical symmetry, thereby performing light-induced structuring in said region in accordance with a desired pattern by concentrating beam intensity via near-field effect behind said colloid sphere monolayer in the propagation direction of light.

* * * * *